United States Patent
Friestad et al.

(10) Patent No.: US 11,457,538 B2
(45) Date of Patent: Sep. 27, 2022

(54) EX CERTIFIED ROBOTIC SYSTEM WITH ENHANCED CORROSION RESISTANCE

(71) Applicant: Canrig Robotic Technologies AS, Sandnes (NO)

(72) Inventors: Jan Friestad, Kleppe (NO); Kenneth Mikalsen, Sandnes (NO); Kjetil Naesgaard, Røyneberg (NO)

(73) Assignee: CANRIG ROBOTIC TECHNOLOGIES AS, Sandnes (NO)

( * ) Notice: Subject to any disclaimer, the term of this patent is extended or adjusted under 35 U.S.C. 154(b) by 0 days.

(21) Appl. No.: 16/713,908

(22) Filed: Dec. 13, 2019

(65) Prior Publication Data
US 2020/0205308 A1     Jun. 25, 2020

Related U.S. Application Data

(60) Provisional application No. 62/783,087, filed on Dec. 20, 2018.

(51) Int. Cl.
*H05K 5/06*     (2006.01)
*H05K 5/02*     (2006.01)
*E21B 41/00*     (2006.01)

(52) U.S. Cl.
CPC .............. *H05K 5/069* (2013.01); *E21B 41/00* (2013.01); *H05K 5/0217* (2013.01)

(58) Field of Classification Search
CPC ........ H05K 5/0217; H05K 5/04; H05K 5/061; H05K 5/063; H05K 5/069; E21B 41/00; E21B 19/165; E21B 19/06
See application file for complete search history.

(56) References Cited

U.S. PATENT DOCUMENTS

| | | | |
|---|---|---|---|
| 5,380,077 A | 1/1995 | Pueschner et al. | |
| 5,600,091 A | * 2/1997 | Rose ................... | H05K 9/0015 174/372 |

(Continued)

FOREIGN PATENT DOCUMENTS

| | | |
|---|---|---|
| CN | 201174634 Y | 12/2008 |
| CN | 202009169 U | 10/2011 |

(Continued)

OTHER PUBLICATIONS

Nord-Lock Inc., Nord-Lock washers product information, May 2012 (Year: 2012).*

(Continued)

*Primary Examiner* — James Wu
(74) *Attorney, Agent, or Firm* — Abel Schillinger, LLP

(57) ABSTRACT

A robotic system with a robot and enclosure, the robotic system configured for explosive (EX) Zone 1 certification. Fasteners attaching a panel to a housing of the enclosure can be positioned away from a seal of the panel, with the seal sealingly engaging the panel and housing when the panel is attached to the housing. The panel overlapping a portion of the housing when attached to the housing, with at least the overlapped portion having a metallized layer and the metallized layer being electrically coupled to the panel when the panel is attached. The panel can be rotationally attached to the housing by one or more hinges. The panel can be configured to assist operators with manual manipulation of the panel by attaching detachable handles to the panel.

16 Claims, 31 Drawing Sheets

(56) References Cited

U.S. PATENT DOCUMENTS

| | | | |
|---|---|---|---|
| 8,173,911 B2* | 5/2012 | Hughes | H05K 9/0045 |
| | | | 174/369 |
| 9,106,011 B2* | 8/2015 | Bengtsson | H01R 13/62 |
| 10,030,997 B2 | 7/2018 | Burkhard et al. | |
| 10,053,928 B2 | 8/2018 | Roodenburg et al. | |
| 10,480,291 B2 | 11/2019 | Wiedecke et al. | |
| 2002/0139555 A1 | 10/2002 | Dodds et al. | |
| 2005/0047884 A1 | 3/2005 | Belik | |
| 2005/0185381 A1* | 8/2005 | Ono | H05K 9/0015 |
| | | | 361/715 |
| 2007/0023183 A1 | 2/2007 | Lesko | |
| 2014/0102803 A1 | 4/2014 | Storhaug et al. | |
| 2015/0330206 A1 | 11/2015 | Trillon et al. | |
| 2016/0005523 A1 | 1/2016 | Jacobs | |
| 2016/0076920 A1 | 3/2016 | Newto et al. | |
| 2016/0102520 A1 | 4/2016 | Noakes et al. | |
| 2017/0074056 A1 | 3/2017 | Roodenburg et al. | |
| 2018/0051526 A1 | 2/2018 | Zouhair | |
| 2018/0171786 A1 | 6/2018 | Kasprzykowski et al. | |
| 2019/0136669 A1 | 5/2019 | Wiedecke et al. | |
| 2020/0199975 A1 | 6/2020 | Friestad et al. | |
| 2020/0199993 A1 | 6/2020 | Friestad et al. | |
| 2020/0347868 A1* | 11/2020 | Hezel | E05B 41/00 |

FOREIGN PATENT DOCUMENTS

| | | |
|---|---|---|
| GB | 2436014 A | 9/2007 |
| GB | 2456905 A | 8/2009 |
| KR | 101778913 B1 | 9/2017 |
| WO | 2009/093069 A2 | 7/2009 |
| WO | 2014/100001 A2 | 6/2014 |
| WO | 2017/087349 A1 | 5/2017 |
| WO | 20170218439 A1 | 12/2017 |
| WO | 2020/126897 A1 | 6/2020 |
| WO | 2020/126899 A1 | 6/2020 |

OTHER PUBLICATIONS

International Search Report from PCT App No. PCT/EP2019/085055 dated Apr. 15, 2020, 2 pgs.

International Search Report from PCT App No. PCT/EP2019/085058 dated Apr. 15, 2020, 2 pgs.

International Search Report from PCT App No. PCT/EP2019/085060 dated Apr. 15, 2020, 3 pgs.

* cited by examiner

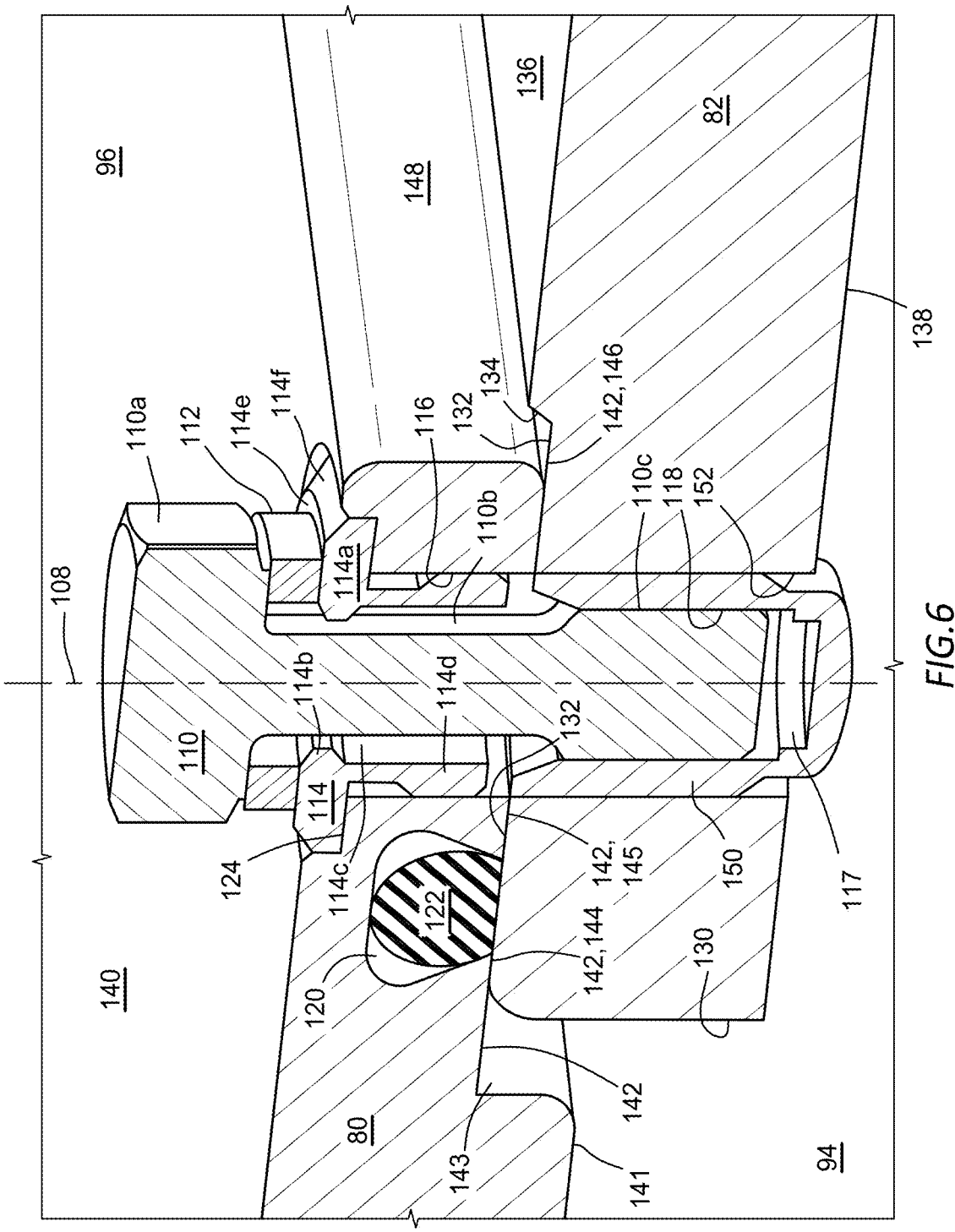

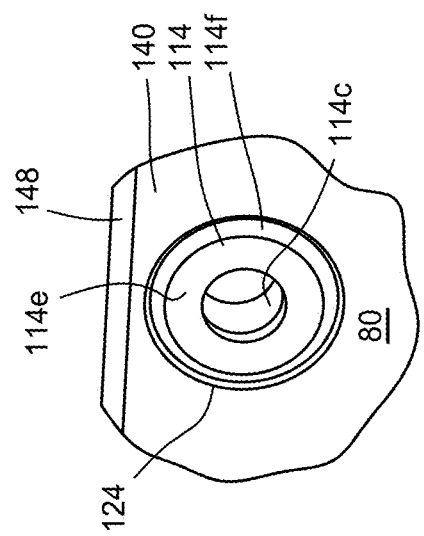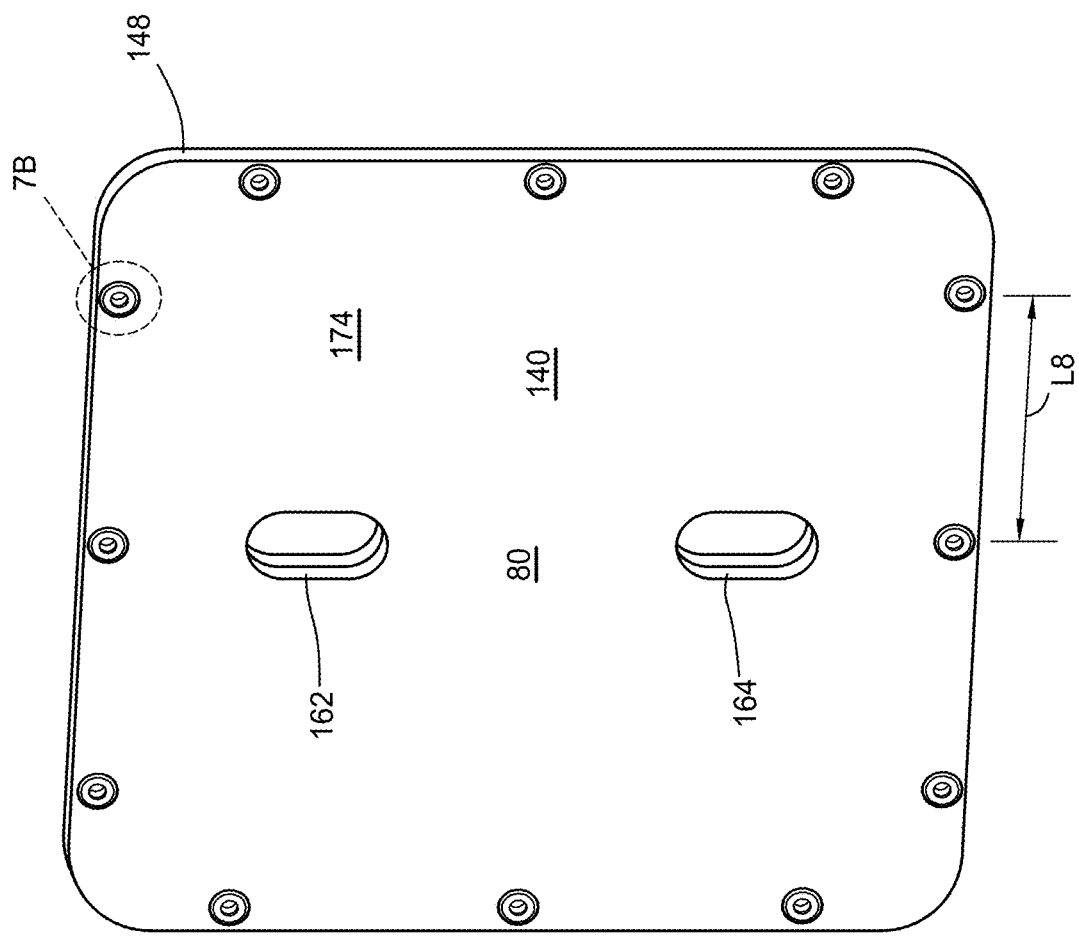

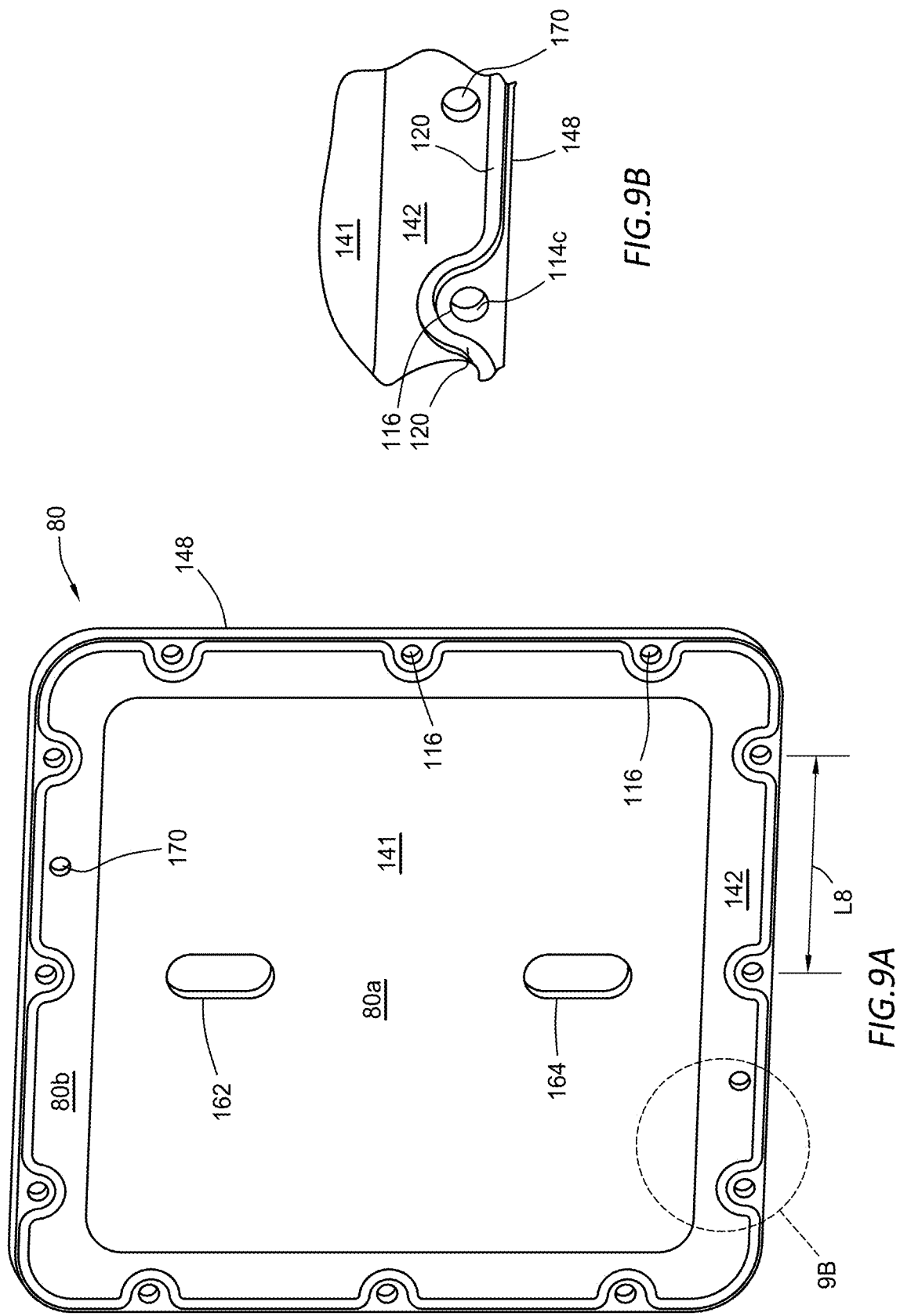

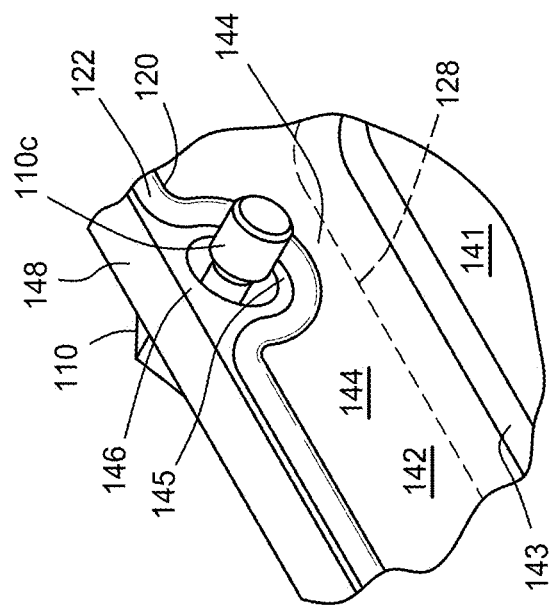
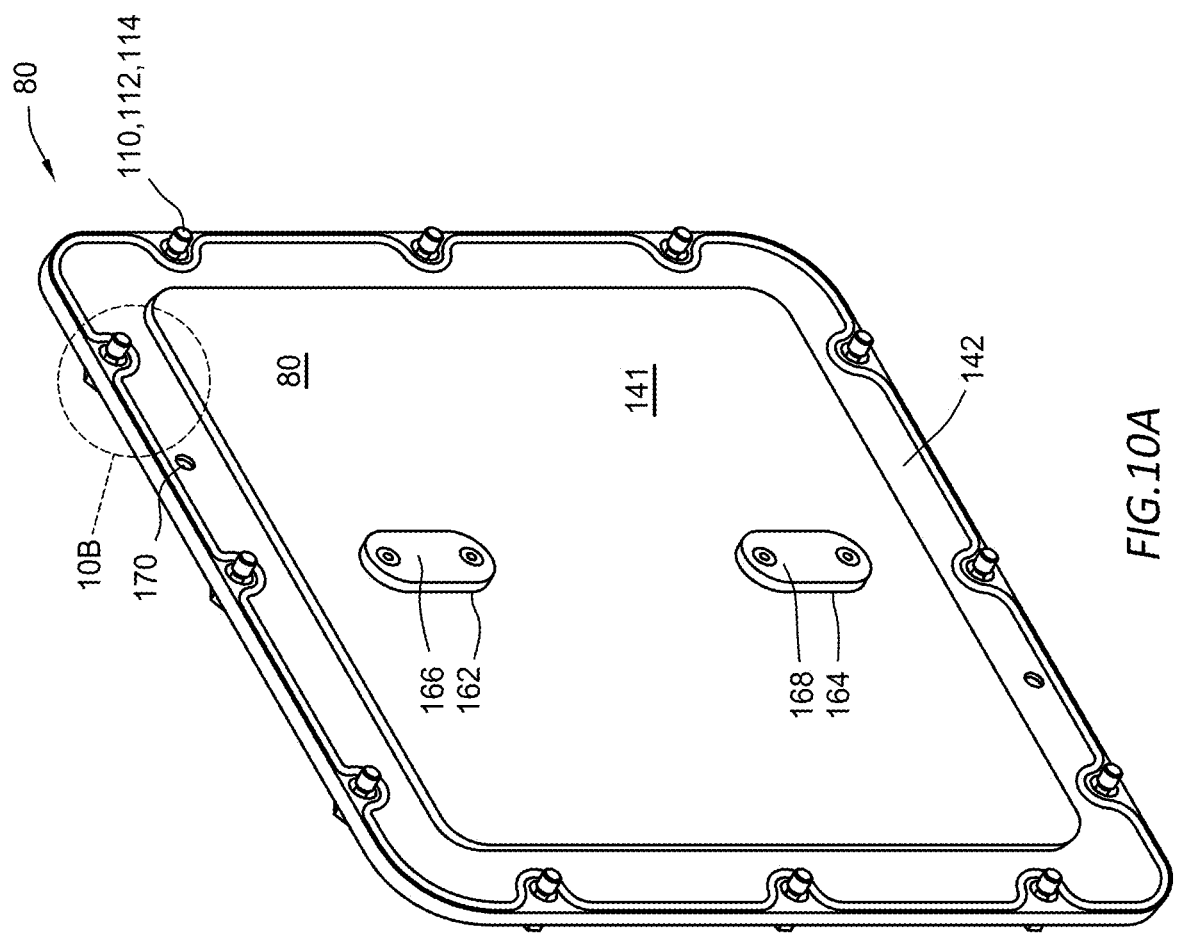
FIG.10B
FIG.10A

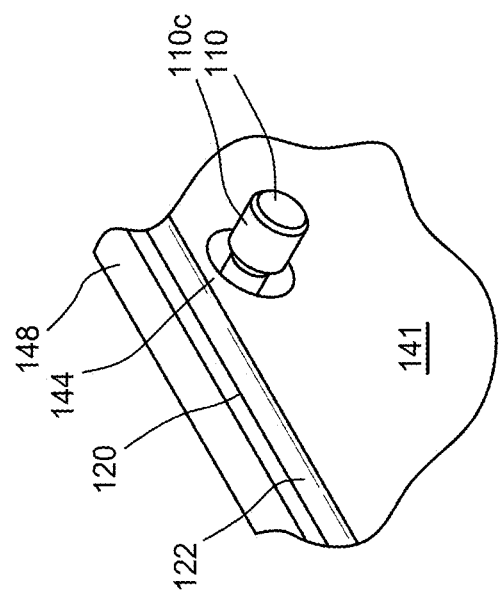
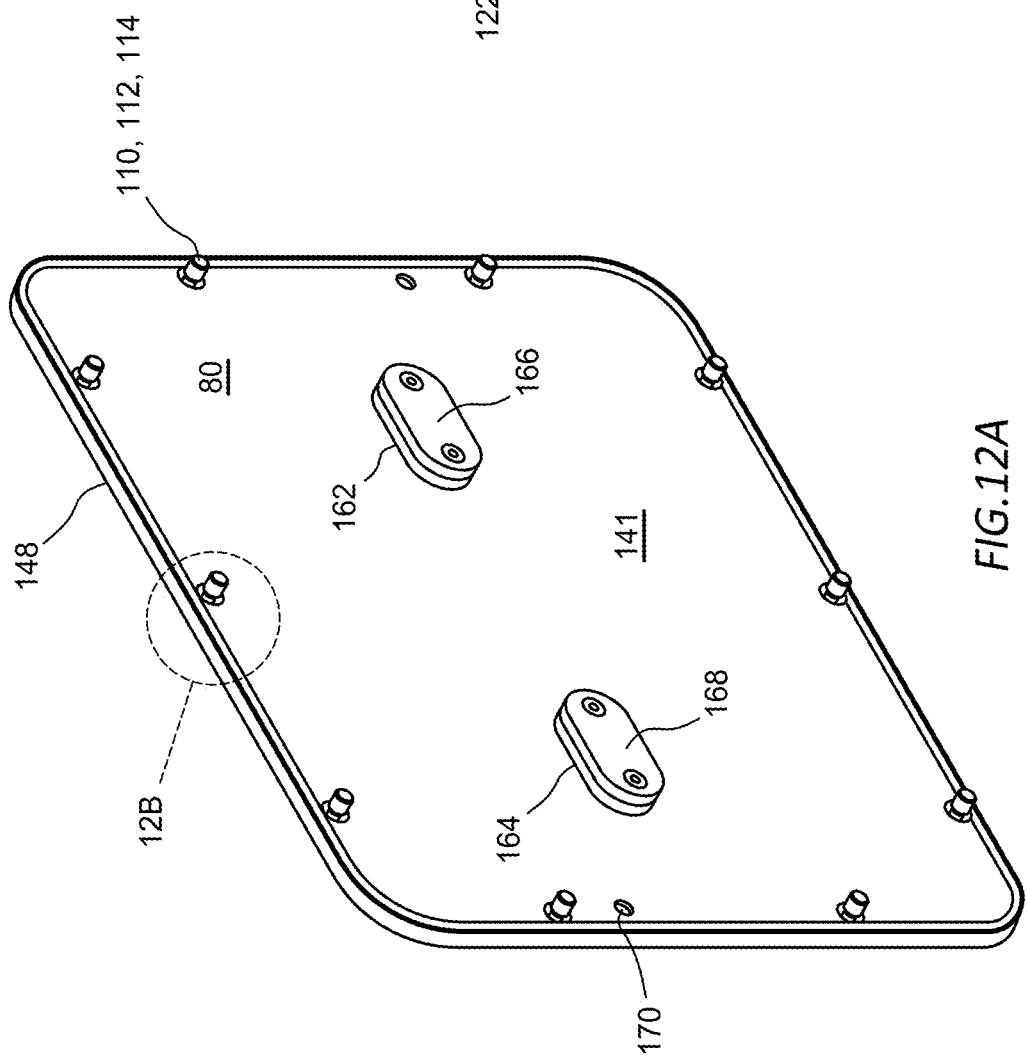
FIG.12B
FIG.12A

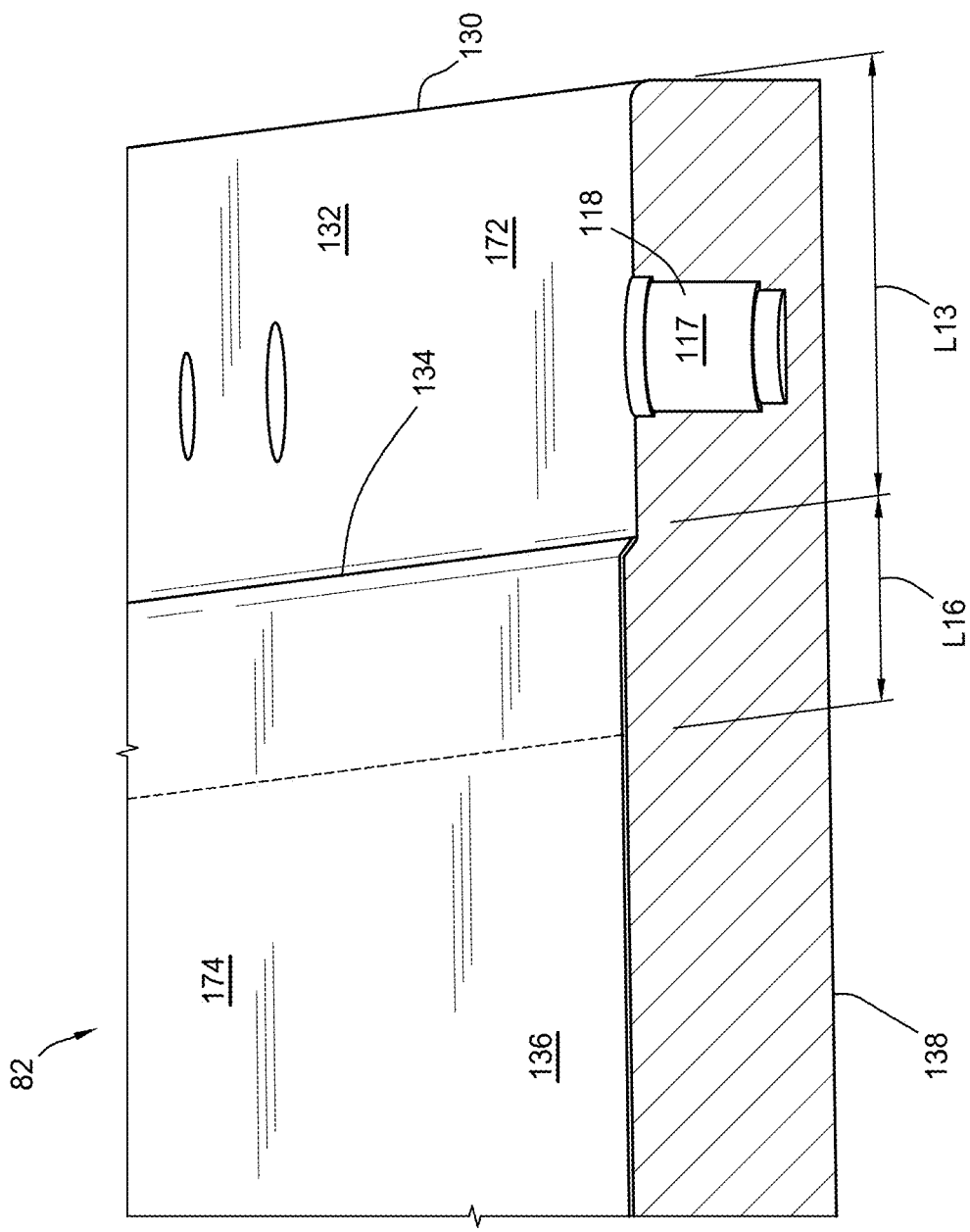

EX CERTIFIED ROBOTIC SYSTEM WITH ENHANCED CORROSION RESISTANCE

CROSS-REFERENCE TO RELATED APPLICATION(S)

This application claims priority under 35 U.S.C. § 119(e) to U.S. Patent Application No. 62/783,087, entitled "EX CERTIFIED ROBOTIC SYSTEM WITH ENHANCED CORROSION RESISTANCE," by Jan FRIESTAD et al., filed Dec. 20, 2018, which application is assigned to the current assignee hereof and incorporated herein by reference in its entirety.

BACKGROUND

Embodiments of the present disclosure relate generally to the field of drilling and processing of wells. More particularly, present embodiments relate to a system and method for operating robotic systems during subterranean operations.

Robots can reduce safety risks to personnel in various subterranean operations by operating in hazardous conditions and/or in dangerous locations, such as handling tubulars to make-up or break-up tubular strings. Tubular (or pipe) handling robots, such as Iron Roughnecks, automated catwalks, tubular elevators, and pipe handlers, can operate on and/or near a rig floor. For example, robotic systems can manage (or assist in management of) tubular segments as they are manipulated between storage areas and a wellbore. However, since the rig floor and surrounding areas may contain explosive materials, any mechanical or electrical sparking can ignite these explosive materials. Therefore, equipment being used on the rig floor or in surrounding areas should be designed to prevent sparking.

Standards have been developed to guide the design of equipment to be used in these hazardous areas. Two standards (ATEX and IECEx) are generally synonymous with each other and provide guidelines (or directives) for equipment design. Each standard identifies groupings of multiple EX zones to indicate various levels of hazardous conditions in a target area.

One grouping is for areas with hazardous gas, vapor, and/or mist concentrations.

EX Zone 0—A place in which an explosive atmosphere consisting of a mixture with air of dangerous substances in the form of gas, vapor or mist is present continuously or for long periods or frequently EX Zone 1—A place in which an explosive atmosphere consisting of a mixture with air of dangerous substances in the form of gas, vapor or mist is likely to occur in normal operation occasionally.

EX Zone 2—A place in which an explosive atmosphere consisting of a mixture with air of dangerous substances in the form of gas, vapor or mist is not likely to occur in normal operation but, if it does occur, will persist for a short period only.

Another grouping is for areas with hazardous powder and/or dust concentrations.

EX Zone 20—A place in which an explosive atmosphere in the form of a cloud of combustible dust in air is present continuously, or for long periods or frequently.

EX Zone 21—A place in which an explosive atmosphere in the form of a cloud of combustible dust in air is likely to occur in normal operation occasionally.

EX Zone 22—A place in which an explosive atmosphere in the form of a cloud of combustible dust in air is not likely to occur in normal operation but, if it does occur, will persist for a short period only.

The Zone normally associated with the oil and gas industry is the EX Zone 1. Therefore, the explosive atmosphere directives or guidelines for robotic systems used in subterranean operations are for an EX Zone 1 environment. Explosive atmosphere directives or guidelines for other EX Zones can be used also (e.g. EX Zone 21). However, the EX Zone 1 and possibly EX Zone 21 seem to be the most applicable for the oil and gas industry. ATEX is an abbreviation for "Atmosphere Explosible". IECEx stands for the certification by the International Electrotechnical Commission for Explosive Atmospheres. ATEX is the name commonly given to two European Directives for controlling explosive atmospheres: 1) Directive 99/92/EC (also known as 'ATEX 137' or the 'ATEX Workplace Directive') on minimum requirements for improving the health and safety protection of workers potentially at risk from explosive atmospheres. 2) Directive 94/9/EC (also known as 'ATEX 95' or 'the ATEX Equipment Directive') on the approximation of the laws of Member States concerning equipment and protective systems intended for use in potentially explosive atmospheres. Therefore, as used herein "ATEX certified" indicates that the article (such as an elevator or pipe handling robot) meets the requirements of the two stated directives ATEX 137 and ATEX 95 for EX Zone 1 environments. IECEx is a voluntary system which provides an internationally accepted means of proving compliance with IEC standards. IEC standards are used in many national approval schemes and as such, IECEx certification can be used to support national compliance, negating the need in most cases for additional testing. Therefore, as used herein, "IECEx certified" indicates that the article (such as an elevator or pipe handling robotic system) meets the requirements defined in the IEC standards for EX Zone 1 environments. As used herein, "EX Zone 1 certified (or certification)" refers to ATEX certification, IECEx certification, or both for EX Zone 1 environments.

Robotic systems usually do not have electrical equipment positioned in the hazardous zones because of the increased probability of sparking due to voltage potentials. If electrical equipment or components are used in the robotic systems, these may be generally placed outside of the hazardous zone while mechanical equipment under hydraulic control operates within the hazardous zone.

An additional concern for equipment operating within the hazardous zone is corrosion. If a robotic system includes electrical equipment operating within the hazardous zone, corrosion of the equipment can further increase sparking potential by exposing parts of the equipment that were properly protected when the equipment was first deployed, as well as causing direct or indirect damage to the electrical components of the system. Therefore, improvements in robotic systems are continually needed.

SUMMARY

One general aspect includes a system for conducting subterranean operations including: a robotic system including an enclosure and a robot, the robotic system configured to be ATEX certified or IECEx certified according to EX Zone 1 requirements, and the enclosure having a corrosion rate of less than 170 micrometers per year (micron/yr).

One general aspect includes a system for conducting subterranean operations including: a robotic system including a robot and an enclosure, the robotic system configured to be ATEX certified or IECEx certified according to EX Zone 1 requirements, the enclosure including: a panel with a panel flange adjacent an edge of the panel; multiple first holes spaced along the panel flange; a housing with a housing flange around a perimeter of an opening in the housing; and a seal element configured to sealingly engage the panel flange and the housing flange when the panel is attached to the housing, with the seal element spaced away from the multiple first holes.

One general aspect includes a system for conducting subterranean operations including: a robotic system including a robot and an enclosure, the robotic system configured to be ATEX certified or IECEx certified according to EX Zone 1 requirements, the enclosure including: a panel with a panel flange adjacent an edge of the panel; multiple first holes spaced along the panel flange; a housing with a housing flange around a perimeter of an opening in the housing; multiple second holes spaced along the housing flange, with the multiple second holes being blind holes; and a pattern of the multiple first holes match a pattern of the multiple second holes.

One general aspect includes a system for conducting subterranean operations including: a robotic system including a robot and an enclosure, the robotic system configured to be ATEX certified or IECEx certified according to EX Zone 1 requirements, the enclosure including: a panel with a panel flange adjacent an edge of the panel; a housing with a housing flange around a perimeter of an opening in the housing; and a seal element configured to sealingly engage the panel flange and the housing flange when the panel is attached to the housing; and a contact surface, with the seal element disposed between the contact surface and the edge of the panel and the contact surface electrically coupled to the housing when the panel is attached to the housing.

One general aspect includes a system for conducting subterranean operations including: a robotic system including a robot and an enclosure, the robotic system configured to be ATEX certified or IECEx certified according to EX Zone 1 requirements, the enclosure including: a housing with an opening in the housing; a panel removably attached to the housing, with the panel covering the opening and overlapping a portion of the housing around a perimeter of the opening when the panel is attached to the housing; and one or more hinges mounted between the housing and the panel, with each hinge having an arm rotationally attached to a panel mounting bracket and a housing mounting bracket.

One general aspect includes a system for conducting subterranean operations including: a robotic system including a robot and an enclosure, the robotic system configured to be ATEX certified or IECEx certified according to EX Zone 1 requirements, the enclosure including: a panel removably attached to a housing; one or more pairs of mounting holes in the panel; a handle insert installed in each of the mounting holes; and one or more detachable handles attached to respective pairs of the handle inserts, each handle including: a handle body with first and second ends, an adjustable structure disposed in each of the first and second ends, the adjustable structure having a feature at a lower end that forms a gap between the feature and the handle body, and rotating the adjustable structure adjusts a size of the gap.

One general aspect includes a method for conducting subterranean operations including: attaching and securing a handle to a removable panel, the removable panel being configured to attach to a housing of a robotic system enclosure; manipulating the removable panel via the handle; attaching the removable panel to the housing; and releasing and detaching the handle from the removable panel.

Embodiments may include one or more of the following features. The method where the attaching and securing the handle further includes: inserting a feature of the handle into a handle insert attached to the removable panel; moving the feature along a slot of the handle insert to an end of the slot; and screwing a locking device to extend a locking protrusion in a recess in the handle insert, thereby securing the feature in the slot and thus securing the handle in the handle insert. The method where the releasing and detaching the handle further includes: unscrewing the locking device to retract the locking protrusion from the recess in the handle insert, thereby releasing the feature in the slot and allowing the feature to be removed from the slot and thus removing the handle from the handle insert. The system where the one or more hinges are adjustable by adjusting the housing mounting bracket in one of a third direction or a fourth direction with the third direction being opposite to the fourth direction, and the third and fourth directions being orthogonal to the first and second directions.

BRIEF DESCRIPTION OF THE DRAWINGS

These and other features, aspects, and advantages of present embodiments will become better understood when the following detailed description is read with reference to the accompanying drawings in which like characters represent like parts throughout the drawings, wherein:

FIG. 6 is another representative partial cross-sectional view along section line 4-4, as indicated in FIG. 3, which is a representative cross-section of the panel and housing interface, in accordance with certain embodiments;

FIG. 7A is a representative perspective top view of a panel of the enclosure shown in FIG. 3, in accordance with certain embodiments;

FIG. 7B is a representative perspective top view of a detailed portion of the panel of FIG. 7A, in accordance with certain embodiments;

FIG. 9A is a representative perspective bottom view of the panel of FIG. 7A, in accordance with certain embodiments;

FIG. 9B is a representative perspective bottom view of a detailed portion of the panel of FIG. 9A, in accordance with certain embodiments;

FIG. 10A is a representative perspective bottom view of the panel of FIG. 8, in accordance with certain embodiments;

FIG. 10B is a representative perspective bottom view of a detailed portion of the panel of FIG. 10A, in accordance with certain embodiments;

FIG. 12A is another representative perspective bottom view of the panel of FIG. 8, in accordance with certain embodiments;

FIG. 12B is a representative perspective bottom view of a detailed portion of the panel of FIG. 12A, in accordance with certain embodiments;

FIG. 14 is another representative perspective view of a portion of the housing shown in FIG. 3, in accordance with certain embodiments;

DETAILED DESCRIPTION

Present embodiments provide a robotic system with electrical components that can operate in hazardous zones (such as one or near a rig floor) during subterranean operations. The robotic system can include a robot and a sealed enclosure that moves with the robot (e.g. integral with the robot), with electrical equipment and/or components contained within the sealed enclosure. The aspects of various embodiments are described in more detail below.

Figure 1:
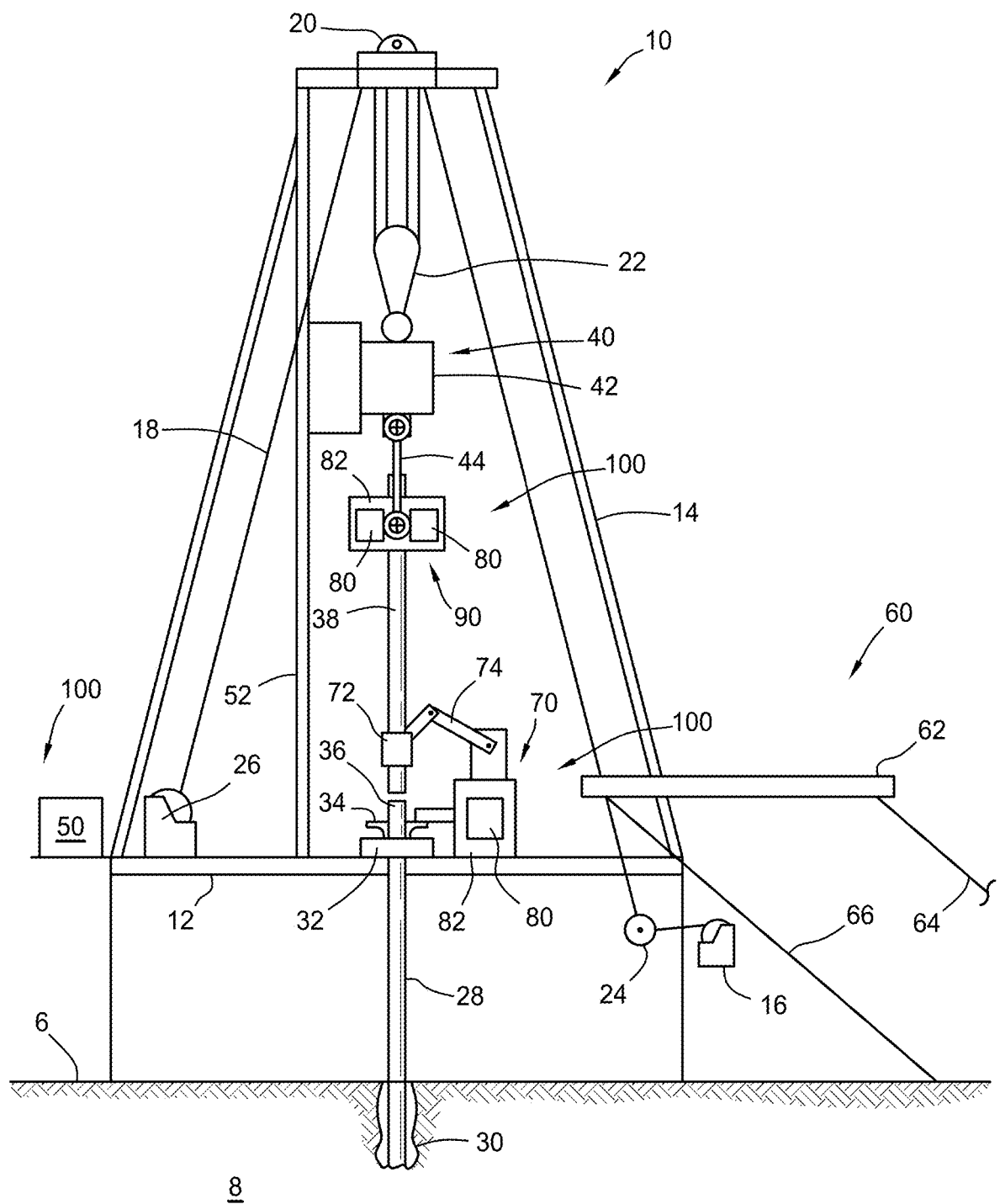
FIG. 1 is a representative side view of a rig being utilized for a subterranean operation (e.g. drilling a wellbore) with one or more supporting robotic systems, in accordance with certain embodiments.

FIG. 1 is a schematic view of a rig 10 in the process of a subterranean operation in accordance with certain embodiments which require providing tubulars to and removing tubulars from a top drive of the rig 10. In this example, the rig 10 is in the process of drilling a well, but the current embodiments are not limited to a drilling operation. The rig 10 can also be used for other operations such as completion, production, recovery, well killing operations, etc. The rig 10 features an elevated rig floor 12 and a derrick 14 extending above the rig floor 12. A supply reel 16 supplies line 18 to a crown block 20 and traveling block 22 configured to hoist various types of drilling equipment above the rig floor 12. The line 18 is secured to a deadline tiedown anchor 24, and a drawworks 26 regulates the amount of line 18 in use and, consequently, the height of the traveling block 22 at a given moment. Below the rig floor 12, a tubular string 28 extends downward into a wellbore 30 formed in the earthen formation 8 through the surface 6 and can be held stationary with respect to the rig floor 12 by a rotary table 32 and slips 34 (e.g., power slips). A portion of the tubular string 28 can extend above the rig floor 12, forming a stump 36 to which another length of tubular 38 (e.g., a joint of drill pipe) may be added.

A tubular drive system 40, hoisted by the traveling block 22, can collect the tubular 38 from a pipe handling system 60 and position the tubular 38 above the wellbore 30. In the illustrated embodiment, the tubular drive system 40 includes a top drive 42, a robotic elevator 90, and a pair of links 44 that couple the elevator to the top drive 42. The robotic elevator 90 can include an enclosure 100 with a housing 82 and one or more panels 80, where the enclosure 100 is a sealed enclosure when the panels 80 are removably attached to the housing 82. The panels 80 can allow access to an interior of the enclosure 100 of the elevator 90 during maintenance operations and protect the interior during normal operations. The tubular drive system 40 may hoist the tubular 38 from the pipe handling system 60, then lower the coupled tubular 38 toward the stump (or stickup) 36 and rotate the tubular 38 such that it connects with the stump 36 and becomes part of the tubular string 28. The tubular drive system 40 can be coupled to a torque track 52, which functions to counterbalance (e.g., counter react) moments (e.g., overturning and/or rotating moments) acting on the tubular drive system 40 and further stabilize the tubular drive system 40 during a tubular string running or other operation.

An iron roughneck 70 can be used to make or break tubulars 38 to the drill string 28 at the stump 36. The iron roughneck 70 can include an enclosure 100 with a housing 82 and one or more panels 80, where the enclosure 100 is a sealed enclosure when the panels 80 are removably attached to the housing 82. The panels 80 can allow access to an interior of the enclosure 100 of the iron roughneck 70 during maintenance operations and protect the interior during normal operations. The arms 72, 74 can be used to handle the tubular 38 as the top drive 40 delivers it to the roughneck 70.

The rig 10 further includes a control system 50, which is configured to control the various systems and components of the rig 10 that grip, lift, release, and support the tubular 38 and the tubular string 28 during a tubular string running or tripping operation. For example, the control system 50 may control operation of the top drive, the elevator, and the power slips 34 based on measured feedback (e.g., from the tubular drive system 40 and other sensors) to ensure that the tubular 38 and the tubular string 28 are adequately gripped and supported by the tubular drive system 40 and/or the power slips 34 during a tubular string running operation. The control system 50 may also control auxiliary equipment, such as mud pumps, pipe handler 60, iron roughneck 70, and the like. The control system 50 may also communicate with other controllers of the auxiliary equipment to control the various systems and components of the rig 10. The control system 50 can include an enclosure 100 that protects the control system during subterranean operations.

In the illustrated embodiment, the control system 50, as well as the auxiliary equipment controllers, can include one or more microprocessors and memory storage. For example, the controllers may be an automation controller, which may include a programmable logic controller (PLC). The memory is a non-transitory (not merely a signal), computer-readable media, which may include executable instructions that may be executed by the controllers. The controller 50 receives feedback from the tubular drive system 40 and/or other sensors that detect measured feedback associated with operation of the rig 10. For example, the controller 50 may receive feedback from the tubular drive system 40 and/or other sensors via wired or wireless transmission. Based on the measured feedback, the controller 50 can regulate operation of the tubular drive system 40 (e.g., increasing rotation speed, increasing weight on bit, retrieving additional tubulars from storage, transporting tubulars to storage, etc.). The auxiliary equipment controllers can receive commands and data from the control system 50 and provide status and data to the control system 50.

The rig 10 may also include a pipe handling system 60 configured to transport tubulars 38 (e.g., single stands, double stands, triple stands) from a horizontal storage to the derrick 14. The pipe handling system 60 can include a horizontal platform 62 that can be raised or lowered along elevator supports 64, 66. The pipe handler 60 is shown delivering the tubular 38 to the rig floor in a horizontal position. However, other pipe handlers may be used that deliver the tubulars to the rig floor at any orientation from horizontal orientations to vertical orientations and any orientation in between.

It should be noted that the illustrations of FIG. 1 are intentionally simplified to focus on the robotic systems that can be used during subterranean operations. Many other components and tools may be employed during the various periods of formation and preparation of the wellbore 30.

Similarly, as will be appreciated by those skilled in the art, the orientation and environment of the wellbore 30 may vary widely depending upon the location and situation of the formations of interest. For example, rather than a generally vertical bore, the wellbore 30, in practice, may include one or more deviations, including angled and horizontal runs. Similarly, while shown as a surface (land-based) operation, the wellbore 30 may be formed in water of various depths, in which case the topside equipment may include an anchored or floating platform. It should also be noted that these various environments can have a wide range of corrosive elements that may impact the equipment used in the subterranean operation in many ways.

Figure 2:
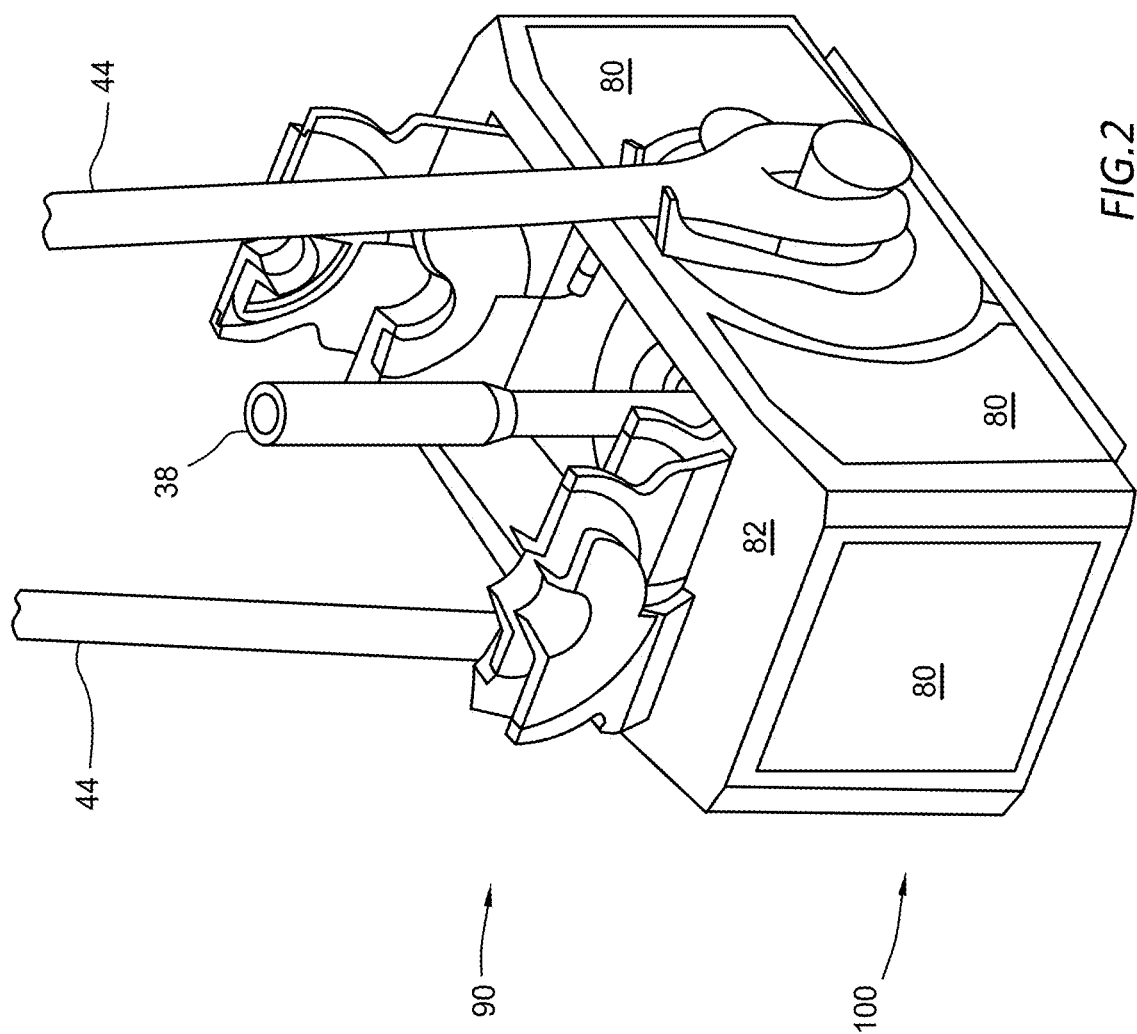
FIG. 2 is a representative perspective view of robotic system in the form of an elevator, in accordance with certain embodiments.

FIG. 2 is a perspective view of a robotic elevator 90 that can contain electrical components within a sealed enclosure 100 while operating in an EX Zone 1 environment. The elevator 90 can include the enclosure 100 with a housing 82 and multiple removable access panels 80. The enclosure 100 can be configured to provide EMI shielding, prevent ingress of environmental fluids, prevent egress of pressure, and prevent (or at least minimize) corrosion of the enclosure 100. Similarly configured enclosures can be used for other robotic systems, such as the pipe handling system 60, a top drive 40, etc.

Figure 3:
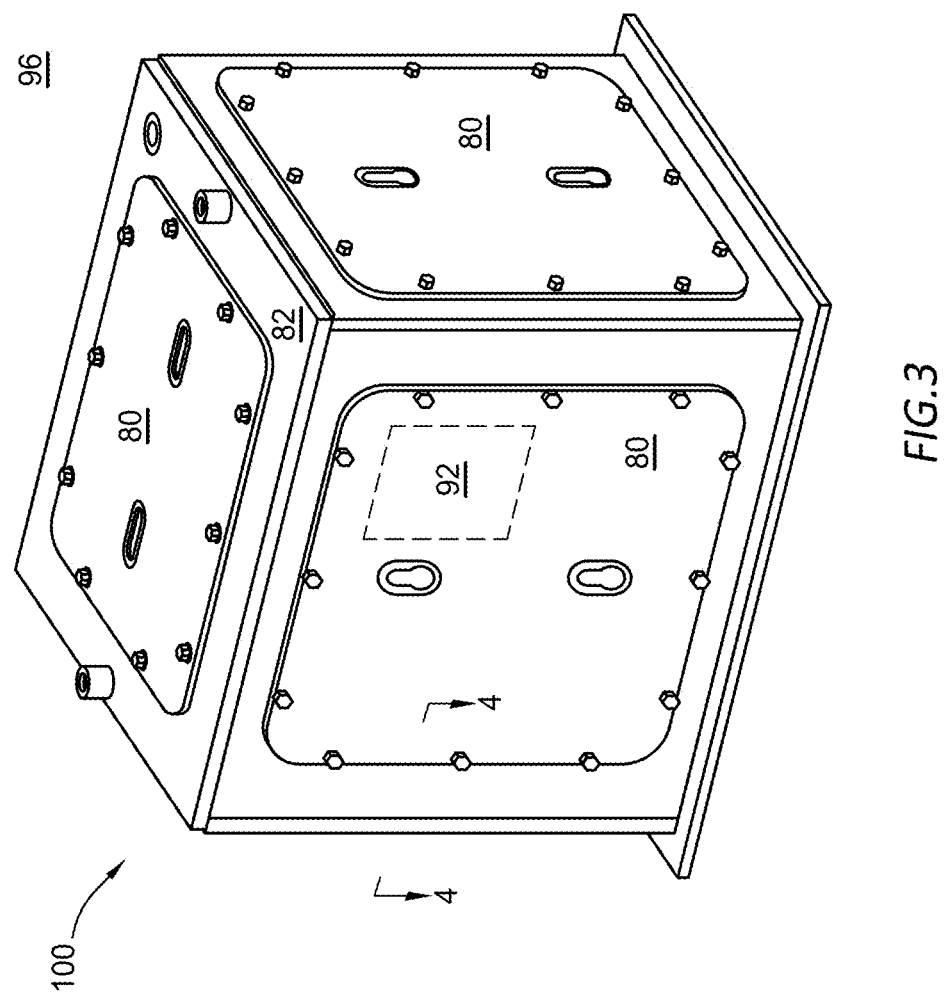
FIG. 3 is a representative perspective view of and enclosure used to house robotic system equipment and minimize corrosion of the enclosure and the equipment, in accordance with certain embodiments.

FIG. 3 is a perspective view of a representative enclosure 100 with a housing 82 and removable panels 80. The housing 82, the panels 80, and the interfaces between them are configured to provide EMI shielding, prevent ingress of environmental fluids from the exterior 96 into the interior 94 (not shown), prevent egress of pressure from the interior 94, and prevent (or at least minimize) corrosion of the enclosure 100. This enclosure 100 can be representative of other enclosures for robotic systems (e.g. the robotic elevator 90, the pipe handling system 60, the top drive 40, the iron roughneck 70, etc.) used in subterranean operations. Therefore, the following description associated with the enclosure 100 and its components can be applicable to other robotic system enclosures used in subterranean operations. The enclosures can be of any suitable shape, such as a rectangular volume (as shown in FIG. 3), a rectangular volume with tapered ends (as shown in FIG. 2), a cylindrical volume, a spherical volume, a frusto-conical volume, a trapezoidal volume, etc.).

The enclosure 100 is configured to be EX Zone 1 certified (i.e. ATEX certified and/or IECEx certified) and to provide enhanced corrosion resistance. The enclosure 100 can contain electrical components 92 in its interior. These electrical components 92 can be electrical motors, electrical actuators, electrical switches, electronic components (e.g. electronic controllers, microprocessors, programmable logic devices, relays, resistors, capacitors, inductors, switches, memory devices, network interface components (optical, electrical, etc.), energy convertors, etc.), as well as other printed circuit board (PCB) mountable components, optical interface devices, and electrical wiring. The enclosure 100, incorporating principles of this disclosure, can have a corrosion rate that is less than 170 micrometers per year (micron/yr), less than 165 micron/yr, less than 160 micron/yr, less than 150 micron/yr, less than 140 micron/yr, less than 130 micron/yr, less than 120 micron/yr, less than 110 micron/yr, less than 100 micron/yr, less than 90 micron/yr, less than 80 micron/yr, less than 70 micron/yr, less than 60 micron/yr, less than 50 micron/yr, less than 40 micron/yr, less than 30 micron/yr, less than 20 micron/yr, less than 10 micron/yr, less than 5 micron/yr, less than 3 micron/yr, or less than 1 micron/yr.

Enclosures 100 with electrical components 92 or any other ignition sources within the interior can have a "purged volume" in the interior. A "purged volume" is a volume in the enclosure 100 that is pressurized with dry air to prevent flammable gasses or other explosive materials from entering the enclosure 100. This prevents (or at least minimizes) the opportunity for explosive materials to be around ignition sources, such as the electrical components 92 in the interior of the enclosure 100. Being dry also prevents condensation from forming within the purged volume.

Enclosures 100 without electrical components 92 or other ignition sources within the interior can have an "unpurged volume" in the interior. An "unpurged volume" is a volume in the enclosure 100 that is unpressurized. An unpurged volume in the enclosure 100 is shielded from environmental conditions (e.g. rain, snow, salt spray, etc.) preventing fluids from outside the enclosure 100 from entering the interior of the enclosure 100. However, moisture within the enclosure 100 can cause condensation and allow corrosion to occur.

Figure 11:
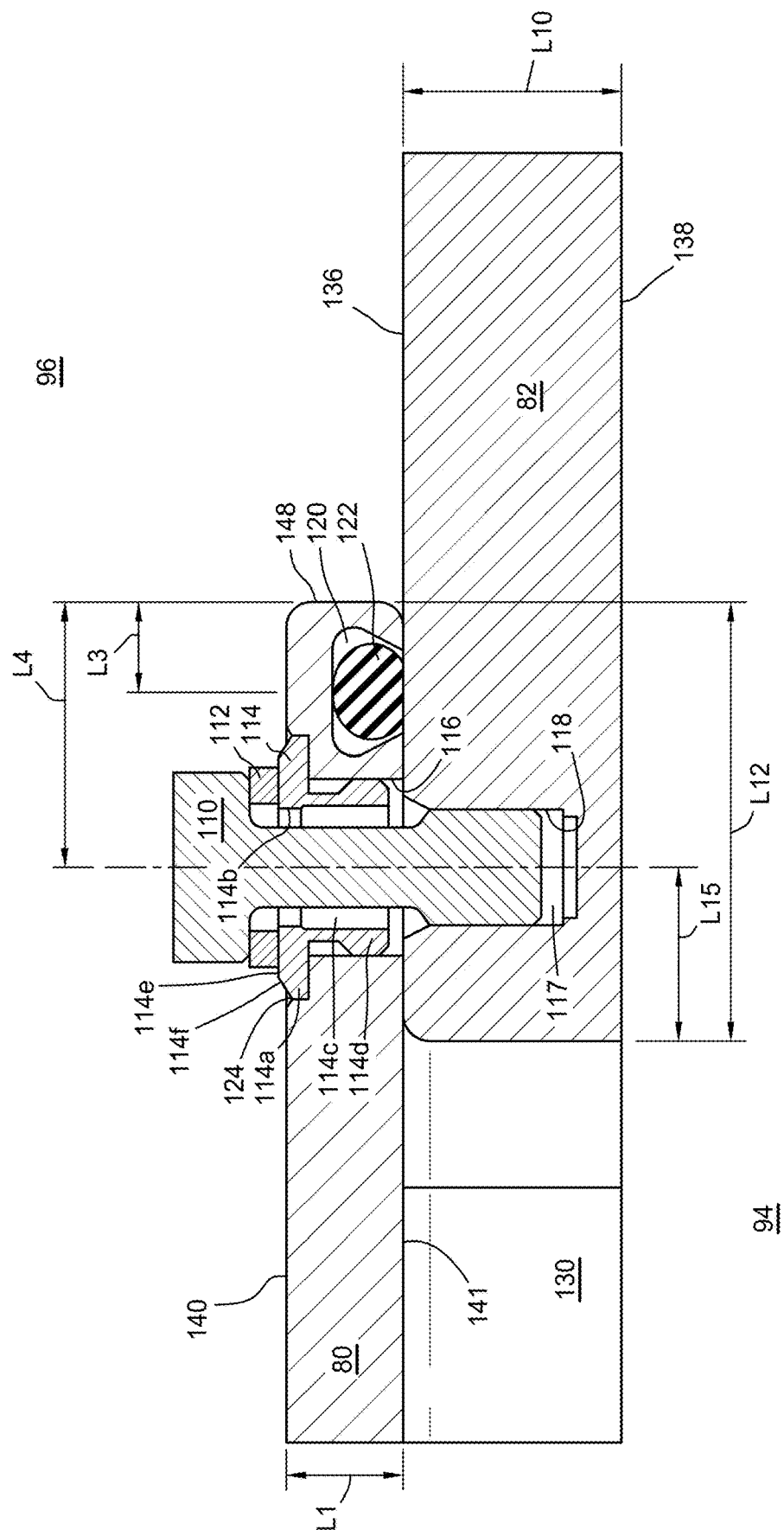
FIG. 11 is a representative partial cross-sectional view along section line 4-4, as indicated in FIG. 3, of an interface of a panel and a housing of an enclosure, in accordance with certain embodiments.

FIGS. 4-6 and 9A-10B are representative of components of an enclosure 100 with a purged volume in its interior 94. It should be understood that the enclosure with the components described regarding FIGS. 4-6 and 9A-10B can be incorporated in an enclosure 100 with an unpurged volume in its interior 94. It is not a requirement that these enclosure embodiment(s) have a purged volume in the interior 94. FIGS. 11-12B are representative of components of an enclosure 100 with an unpurged volume in its interior 94. The remaining figures are representative of components of an enclosure 100 with either a purged or unpurged interior volume.

Figure 4:
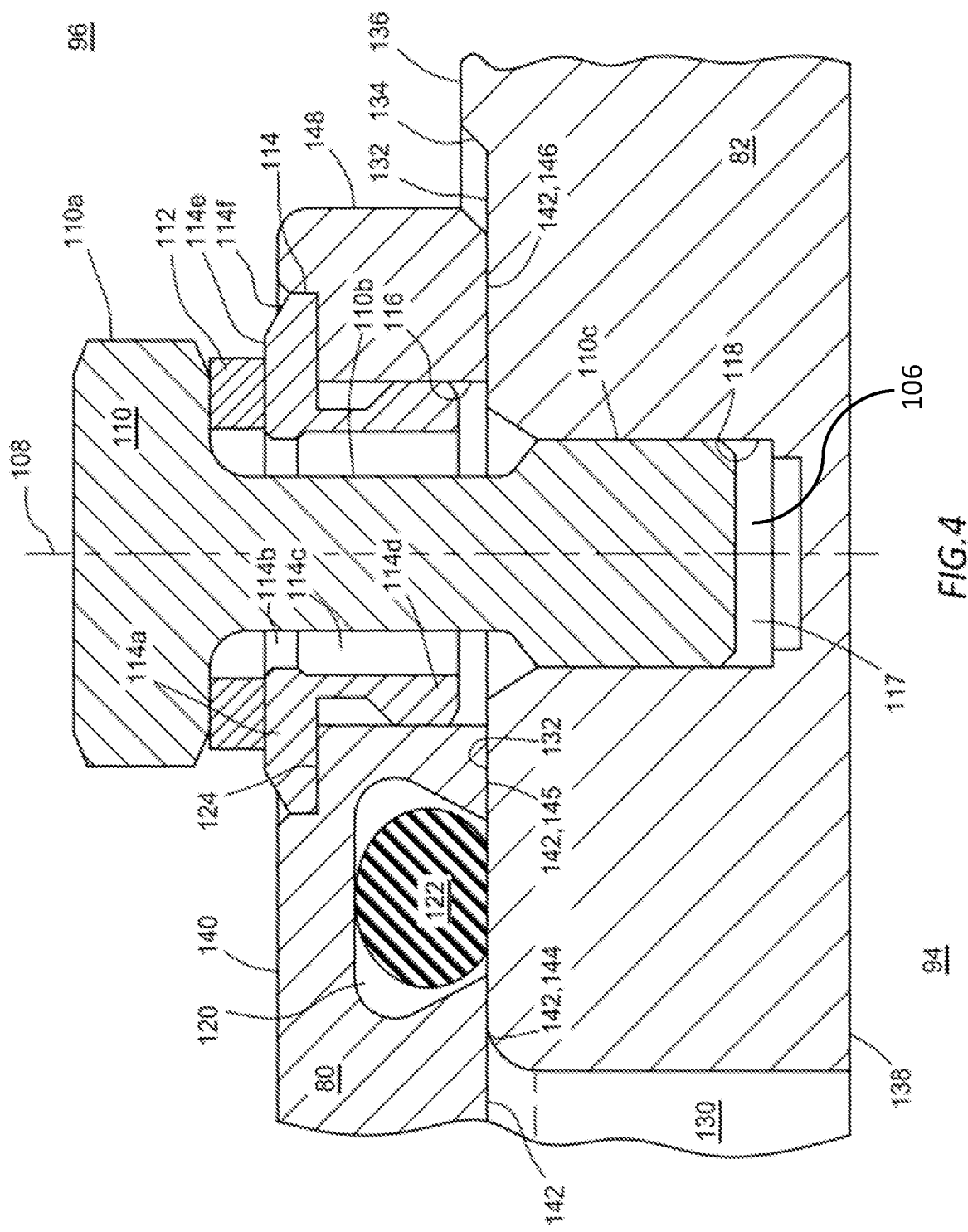
FIG. 4 is a representative partial cross-sectional view along section line 4-4, as indicated in FIG. 3, of an interface of a panel and a housing of an enclosure, in accordance with certain embodiments.
Figure 5:
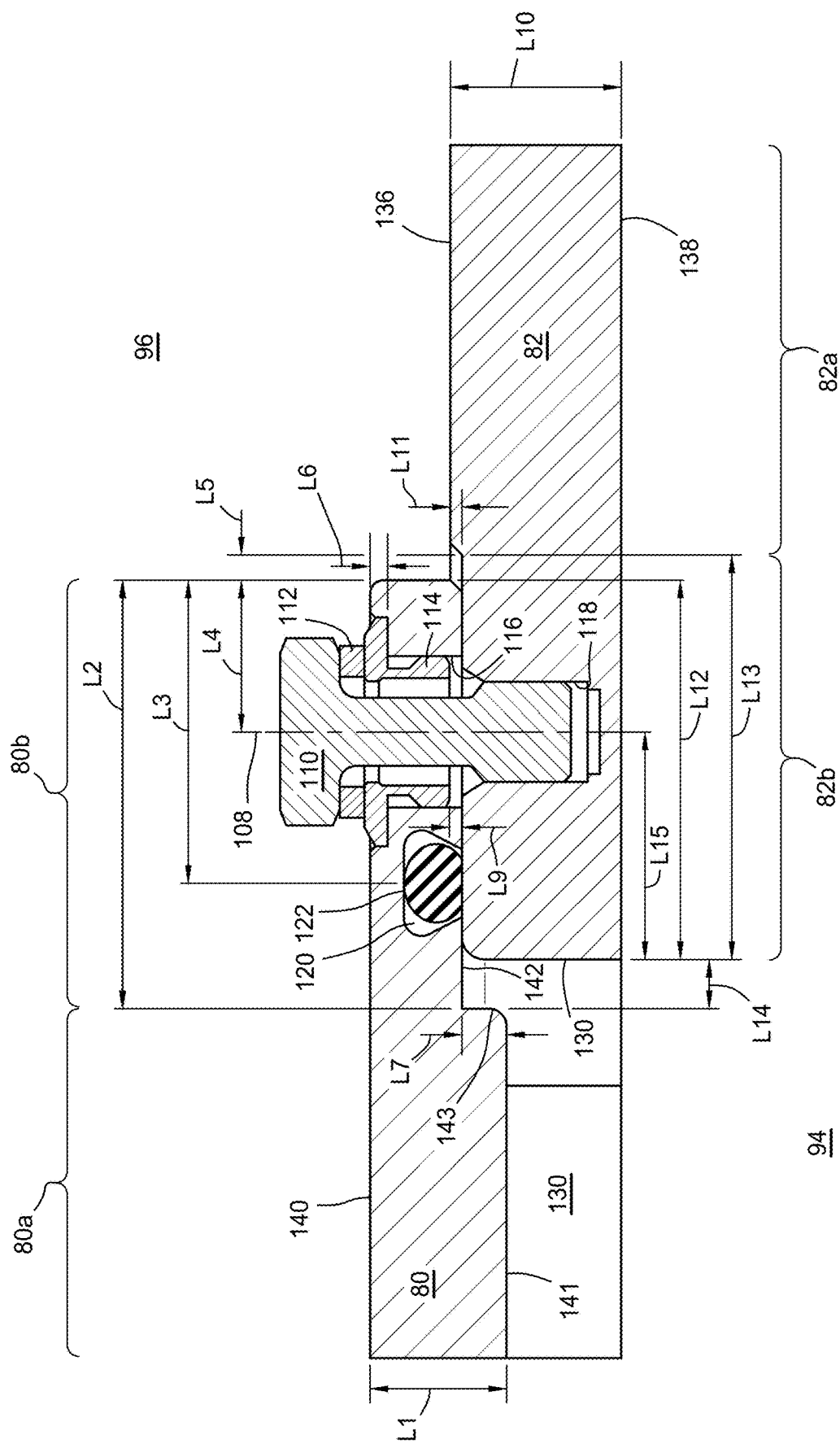
FIG. 5 is another representative partial cross-sectional view along section line 4-4, as indicated in FIG. 3, which is a representative cross-section of the panel and housing interface, in accordance with certain embodiments.

Referring now to FIGS. 4 and 5 that are representative cross-sectional views along section line 4-4, as indicated in FIG. 3, which show an interface between the housing 82 and a removable panel 80 where the flange on the housing 82 is equal to or greater than 15 mm thick. The panel 80 can be attached to the housing 82 via multiple fasteners 110. The fasteners 110 can be installed through respective panel holes 116, into housing blind holes 117, and engaging threads 118. Each fastener 110 can be a captive fastener as shown in FIG. 4 as well as other suitable fasteners for removably attaching the panel 80 to the housing 82. If a captive fastener 110 is used, a bushing 114 can be installed (e.g. press-fit, welded, glued, fused, etc.) in the hole 116 with the portion 114d being forced into the hole 116 to secure the bushing 114 in the hole 116. When being glued as opposed to press-fit, the bushing 114 can be screwed into the hole 116 with glue on the threads, and afterwards mechanically fixed by making an indent in the area between the insert and the structure thus locking the threads. The bushing 114 can include a top surface 114e and an inclined surface 114f. The top surface 114e can engage the washer 112 on one side, and the fastener head 110a can engage the washer 112 on an opposite side. A flange 114a can be disposed in a recess 124 with the recess 124 surrounding the hole 116 and extending below the top surface 140.

The bushing 114 can have a threaded portion 114b that allows the fastener 110 to be threaded in and removed from the bushing 114. The threaded portion 114b also retains the fastener 110 in the bushing when the panel 80 is removed from the housing 82. The fastener 110 can include a head 110a, a body 110b, and a threaded portion 110c. The threaded portion 110c can engage the threaded portion 114b as the fastener 110 is installed in the bushing. Once the threaded portion 110c is threaded through the portion 114b, the body portion 110b allows the fastener 110 to freely rotate in the bushing since the diameter of the body portion 110b is less than an inner diameter of the threaded portion 114b. A washer 112 (e.g. a Nord Lock® washer) can be installed between the head 110a and the bushing 114. If the washer 112 is a lock washer, then it will tend to prevent loosening of the fastener 110. The head 110a can be used to engage tools that rotate the fastener 110 during attachment or detachment of the housing 82. The threaded portion 110c can engage threads 118 in the blind hole 117 to secure the panel 80 to the housing 82. The blind hole 117 can be filled with a lubricant (e.g. grease, oil, or another suitable substance) for protecting the threads 118 and blind hole 117 from corrosion (galvanic or otherwise) as well as reducing friction between the fastener 110 and the threads 118. Clearance below the fastener 110 when the fastener is installed in the blind hole provides a closed volume 106 for the lubricant to collect when the fastener 110 is installed.

In this configuration, the housing 82 has an opening that is covered by the panel 80 when the panel 80 is attached to the housing 82. The housing 82 can have a reduced thickness portion around the perimeter of the opening which can be referred to as a flange 82b. The rest of the housing 82 is referred to as a body 82a. The panel 80 can have a reduced thickness portion around the perimeter of the panel 80 which can be referred to as a flange 80b. The rest of the panel 80 is referred to as a body 80a. When installed on the housing 82, the panel flange 80b at least partially overlaps the housing flange 82b, with the holes 116 in the panel flange 80b being aligned with the blind holes 117 in the housing flange 82b.

The panel 80 can include a top surface 140, an edge 148, and a bottom surface 142, which can include surfaces 144, 145, 146. The housing 82 can have a bottom surface 138, an edge 130, a top surface 136, a flange surface 132, and a transition surface 134 that transitions between the top surface 136 and the flange surface 132. When the panel 80 is installed on the housing 82, the panel flange 80b engages the housing flange 82b when panel 80 is secured to the housing 82. The housing flange surface 132 can contact the surfaces 144, 145, and 146 of the surface 142. The surface 144 refers to the portion of the bottom surface 142 that is positioned between a groove 120 and the edge 130 of the housing 82 when the panel 80 is installed on the housing 82. The surface 145 refers to the portion of the bottom surface 142 that is positioned between the groove 120 and the blind hole 117. Surface 146 refers to the portion of the surface 142 that is positioned between the blind hole 117 and the edge 148 as well as the portion of the surface 142 that is between the groove 120 and the edge 148. In this configuration, the groove 120 is formed in the surface 142 such that the fastener 110 is positioned between the groove 120 and the edge 148. At positions along the perimeter of the panel 80 where fasteners 110 are not present, the groove can be positioned closer to the edge 148 (see FIG. 9A).

The surface 142 (including contact surfaces 144, 145, 146) can be configured to electrically couple to the surface 132 (or metalized layer 172, see FIG. 13A) of the housing 82 when the panel 80 is installed on the housing 82. In one or more embodiments, an enclosure 100 with an unpurged interior volume can have surfaces 141, 142 (including surfaces 144, 145, 146) be painted with a corrosion resistant paint. The groove 120, and surfaces of the bushings 114 (i.e. the top surface 114a, the bushing thread 114b, and internal surface 114c) can be masked to prevent them from being painted. In one or more embodiments, an enclosure 100 with a purged interior volume can have surfaces 141, 143, 145, 146 painted with a corrosion resistant paint. The surfaces 144, the groove 120, and surfaces of the bushings 114 (i.e. the top surface 114a, the bushing thread 114b, and internal surface 114c) can be masked to prevent them from being painted. In the purged volume embodiments, the portion of the panel 80 at the surfaces 145, 146 can be reduced in thickness (preferably 0.5 mm) relative to a thickness of the portion of the panel 80 at the surface 144 to allow clearance for any build-up of paint on the surfaces 145, 146. With the surfaces 145, 146 painted, then the portion of the surface 142 (i.e. surfaces 145, 146) that is between the groove 122 and the panel edge 148 can be painted with corrosion resistant paint while the portion of the surface 142 (i.e. surface 144) is not painted and can still make contact with the surface 132 of the housing 82 to provide electrical coupling between the surface 132 (or metalized layer 172, see FIG. 13A) of the housing 82 when the panel 80 is installed on the housing 82. By electrically coupling the panel 80 with the housing 82, EMI emissions can be reduced to acceptable levels (i.e. not interfering with other equipment) and the panel 80 can be held at the same potential (e.g. a reference ground potential) as the housing 82 limiting voltage potential differences between the panel 80 and the housing 82 and reducing the potential for sparking. This electrical coupling provides an electrical barrier to electromagnetic signals and prevents (or at least minimizes) transmission of electromagnetic signals from an interior of the housing 82. This allows the enclosure 100 to meet Electromagnetic Compatibility (EMC) standards for housings with electrical components 92 contained within (refer to FIG. 3).

These electrical components 92 can be electrical motors, electrical actuators, electrical switches, electronic components (e.g. electronic controllers, microprocessors, programmable logic devices, relays, resistors, capacitors, inductors, switches, memory devices, network interface components, energy convertors, etc.), as well as other printed circuit board (PCB) mountable components, optical interface devices, and electrical wiring. The electrical coupling between the panel 80 and the housing 82 allows the enclosure 100 to meet EMC standards which can be measured by the IEC standards testing, such as "*IEC EN 61000-4-2, Electromagnetic compatibility (EMC)*—Part 4-2: *Testing and measurement techniques—Electrostatic discharge immunity test*," or the "*IEC EN 61000-4-3, Electromagnetic compatibility (EMC)*—Part 4-3: *Testing and measurement techniques—Radiated, radio-frequency, electromagnetic field immunity test*," or the "*Directive* 2014/30/*EU of 26 Feb.* 2014 *on the harmonisation of the laws of the EU Member States relating to electromagnetic compatibility.*"

EMC pursues three main classes of issue. Emission is the generation of electromagnetic energy, whether deliberate or accidental, by some source and its release into the environment. The second class, susceptibility, is the tendency of electrical equipment, referred to as the victim, to malfunction or break down in the presence of unwanted emissions, which are known as Radio frequency interference (RFI). Immunity is the opposite of susceptibility, being the ability of equipment to function correctly in the presence of RFI, with the discipline of "hardening" equipment being known equally as susceptibility or immunity. The third class is coupling, which is the mechanism by which emitted interference reaches the victim. Electromagnetic Compatibility (EMC) standards ensure that enclosures 100 with electrical components contained within can operate as needed while not effecting the operations of surrounding equipment via electromagnetic emissions and not being affected by electromagnetic emissions from surrounding equipment. This enclosure meets the Electromagnetic Compatibility (EMC) standards for equipment operating on or around a rig. The electrical coupling between the panel 80 and the housing 82 reduce electromagnetic emissions to acceptable levels and prevents reception of unacceptable levels of electromagnetic emissions from surrounding equipment.

A resilient seal 122 can be disposed in the groove 120 such that when the panel 80 is attached to the housing 82, the seal 122 sealingly engages the groove 120 and the flange surface 132 to minimize or prevent flow of fluids into the housing past the seal 120. The seal 122 can also minimize or prevent a release of pressure from the interior 94 of the housing 82 to the exterior 96 allowing the housing 82 to maintain an internal positive pressure. The interior can be a purged volume that is pressurized and filled with dry air (i.e. virtually no moisture content in the air). For fluid to flow from the exterior 96 to the interior 94 through this and other similar cross-sections, the fluid must pass the seal 122. The fasteners 110 are installed in blind holes 117 which prevent fluid from flowing past the fasteners 110 into the interior 94. Also, the fasteners 110 are positioned between the edge 148 and the seal 122, fluid that may pass through the panel hole 116 would still have to pass the seal 122 to enter the interior 94. An interior 94 pressurized with dry air and, sealing engagement between the panel 80 and the housing 82, via the seal 122, can prevent ingress of fluids from the exterior, galvanic corrosion of components in the interior 94, and combustion of explosive materials contained in the explosive atmosphere external to the enclosure 100.

Referring to FIG. 5, L1 is the thickness of the body 80*a*. L2 is the distance from the panel edge 148 to the panel transition surface 143. Therefore, L2 is also the width of the panel flange surface 142. In some configurations without a flange 80*b*, then L2 will be "0." L3 is the distance from the panel edge 148 to a center of the groove 120. In some configurations L3 can vary along the perimeter of the panel 80 as the groove runs proximate the panel edge 148 and then tracks away from the panel edge 148 to route around a fastener 110. L4 is the distance from the panel edge 148 to the central axis 108 of the fastener 110. L5 is the distance from the panel edge 148 to the housing transition surface 134. L6 is the depth of the recess 124 from the top surface 140. Therefore, L6 is also the depth that the flange 114*a* of the bushing 114 is positioned below the top surface 140. L7 is the distance from the bottom surface 141 to the flange surface 142. L9 is the distance from the bottom of the bushing 114 to the housing. This distance prevents galvanic corrosion between the bushing and the material of the housing.

L10 is the thickness of the housing body portion 82*a*. L11 is the distance from the housing top surface 136 to the housing flange surface 132. L12 is the distance from the housing edge 130 to the panel edge 148 when the panel 80 is attached to the housing 82. L13 is the distance from the housing edge 130 to the housing transition surface 134. L14 is the distance from the housing edge 130 to the panel transition surface 143 when the panel 80 is attached to the housing 82. It is preferred that the distance L14 be 10 mm or greater. L15 is the distance from the housing edge 130 to the central axis 108 of the fastener 110 when the panel 80 is attached to the housing 82. Therefore, L15 is also the distance from the housing edge 130 to the central axis of the blind hole 117.

FIG. 6 is a representative cross-sectional view along section line 4-4, as indicated in FIG. 3, that shows an interface between the housing 82 and a removable panel 80 where the flange 82*b* on the housing 82 is less than 15 mm thick. Similar elements described above with reference to FIGS. 4 and 5 are the same except for at least the insert 150 that includes the blind hole 117 with the threads 118. The insert 150 is used in this configuration because the thickness of the housing 82 at the flange 82*b* may not be enough material to ensure integrity of the flange 82*b* if the blind hole 117 is drilled in the housing flange 82*b* at a desired depth. Therefore, a larger diameter hole 152 can be drilled through the housing flange 82*b* and the insert 150 can be installed (e.g. press-fit, welded, glued, fused, etc.) in the hole 152.

Aluminum and steel are dissimilar metals and are subject to considerable galvanic corrosion when in contact in a corrosive atmosphere. Therefore, in subterranean operational environments, which can be corrosive atmospheres, contact between such dissimilar metals can cause galvanic corrosion. However, galvanic corrosion does not occur when dissimilar metals, like steel and aluminum, are completely dry. For example, if a steel object is metallized with a layer of aluminum, galvanic corrosion will not occur between the steel and the metalized aluminum if the interface remains dry. One embodiment of the enclosure 100 can include steel, aluminum, and stainless steel in a configuration that prevents (or at least minimizes) corrosion, including galvanic corrosion. The material of the cover 80 can be aluminum and the material of the housing 82 can be steel.

As shown in FIGS. 7A and 7B, the surface 140 and edge 148 of the panel 80 can be painted with corrosion resistant paint 174 where various features can be masked off to prevent paint from adhering to those features, such as threads. The painting can include exposed surfaces of the recess 124 as well as inclined surfaces 114*f* of the bushings 114. It is preferred to mask off the surfaces 114*c* and 114*e* to provide electrical coupling with the washer 112 and the fastener head 110*a*. The edges of the handle insert holes 162, 164 can also be painted. The washer 112, the fastener 110, and the bushing 114 can be made from stainless steel which can minimize corrosion when contacting aluminum. The fastener head 110*a* engages the washer 112, and the washer 112 is configured to engage the unpainted bushing surface 114*e*. The bushing 114 can be press-fit into the hole 116 providing an airtight fit between the stainless steel bushing 114 and the aluminum of the panel 80. With the inclined surface 114*f* and the exposed surfaces of the recess 124 being painted and the airtight press-fit interface between the bushing 114 and the panel 80, the interface between the bushing 114 and the panel 80 should remain dry to prevent corrosion between the aluminum panel 80 and the stainless steel bushing 114. L8 is the spacing of the fasteners 110 around the panel flange 80*b*. For the embodiments with reduced thickness flanges for the panel 80 and housing 82 (e.g. FIG. 4), the spacing L8 between the fasteners 110 can be up to 200 mm. For the embodiments without the reduced thickness flanges (e.g. FIG. 11), the spacing L8 between the fasteners 110 can be up to 300 mm.

Figure 8:
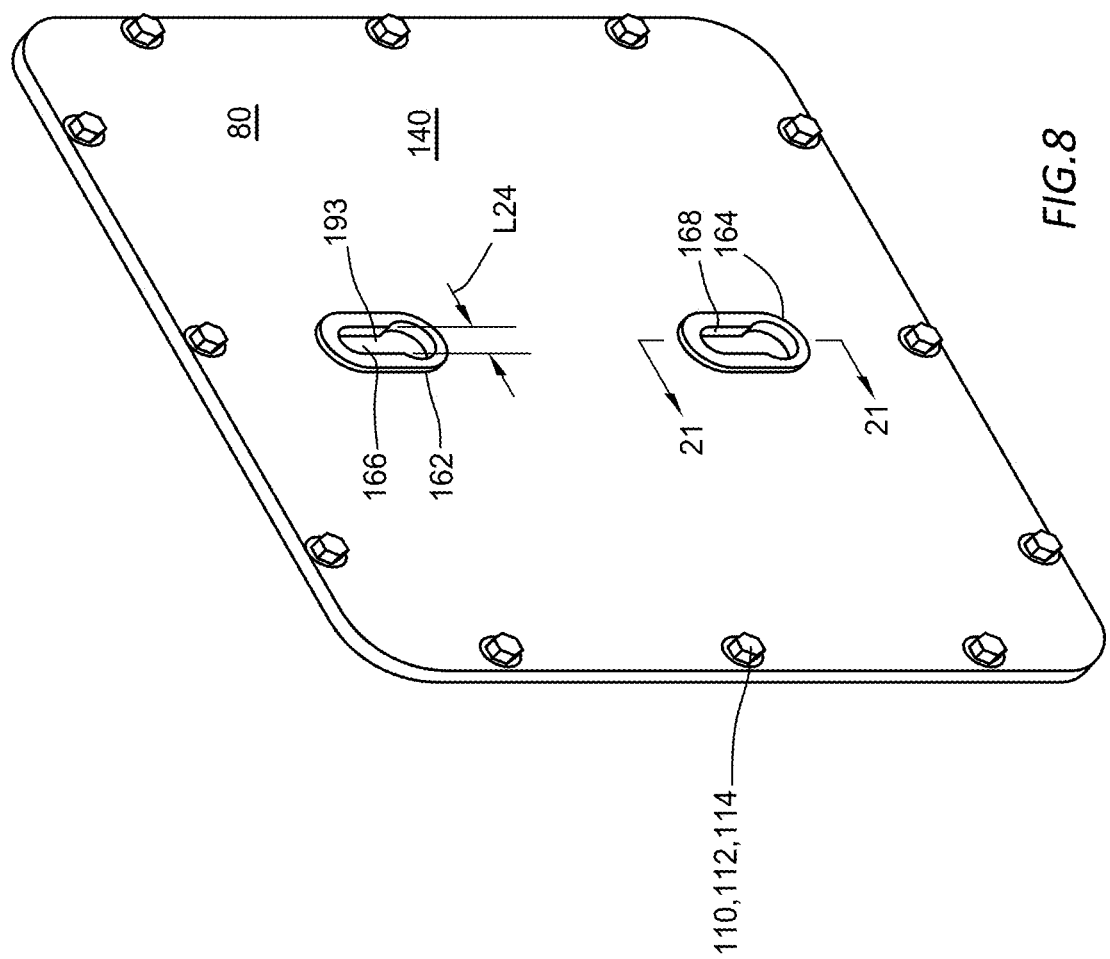
FIG. 8 is a representative perspective top view of a panel of the enclosure shown in FIG. 3, with fasteners installed, in accordance with certain embodiments.

FIG. 8 shows a perspective top view of the panel 80 with fasteners 110, washers 112, and bushings 114 installed at each of the hole 116 locations. The fasteners 110 can be held captive in the holes 116 by the bushings 114. Handle inserts 166, 168 are installed in the handle insert holes 162, 164, respectively. L24 is the width of the slot 193 in the inserts 166, 168, which are used to retain a handle when the handle is installed in the inserts 166, 168.

FIGS. 9A and 9B are perspective and detailed views of the bottom surfaces 141, 142 of the panel 80. These surfaces are preferably unpainted allowing the aluminum of the panel 80 to contact the housing flange 82*b* when the panel is attached to the housing 82. The bottom surface 141 is the bottom surface of the body 80*a* and can include the handle insert holes 162, 164 for receiving a handle insert. The surface 142 is the bottom surface of the flange 80*b* and can include multiple holes 116, alignment holes 170, and the groove 120.

As explained above, the groove 120 can be proximate the edge 148 along the perimeter of the panel 80, with the groove being routed away from the edge 148 such that the holes 116 are positioned between the groove and the edge 148, which can form a pattern of the groove 120 as shown in FIG. 9A. Multiple alignment holes 170 can assist in aligning of the panel 80 to the housing 82 when the panel 80 is being attached to the housing 82. The alignment holes 170 are preferably blind holes that can each receive an alignment pin during assembly. The alignment pins can be attached to the housing flange 82*b* and used to align the panel 80 to the housing 82. However, alignment pins are not required. The panel 80 can be attached to the housing 82 without using alignment pins.

FIGS. 10A and 10B are perspective and detailed views of the bottom side of the panel 80. In this embodiment, fasteners 110, washers 112, and bushings 114 are installed at the holes 116, a resilient seal 122 is installed in the groove 120, and handle inserts 166, 168 are installed in the insert holes 162, 164, respectively. The FIG. 10B clearly shows the path of the groove 120 and seal 122 around the fastener 110, as well as the transition surface 143 positioned between the bottom surface 141 and the flange surface 142. The contact surfaces 144, 145, and 146 are shown as part of the flange surface 142. The dashed line 128 indicates where the edge 130 of the housing 82 would be when the panel 80 is attached to the housing 82. The contact surface 144 is the portion of the surface 142 that is between where the edge of the housing 82 (dashed line 128) would be when the panel 80 is attached to the housing 82.

FIG. 11 is a representative partial cross-sectional view along section line 4-4, as indicated in FIG. 3, which shows an interface between the housing 82 and a removable panel 80 where the flange on the housing 82 is equal to or greater than 15 mm. The fasteners 110 can be installed through respective panel holes 116, into housing blind holes 117, and engaging threads 118. As described above, the fastener 110 can be a captive fastener, as well as other suitable fasteners for removably attaching the panel 80 to the housing 82. If a captive fastener 110 is used, a bushing 114 can be installed (e.g. press-fit, welded, glued, fused, etc.) in the hole 116 with the portion 114*d* being forced into the hole 116 to secure the bushing 114 in the hole 116. When glued in place, the bushing 114 can be screwed into the hole 116 with glue on the threads, and afterwards mechanically fixated by making an indent in the area between the insert and the structure thus locking the threads. The other portions of the bushing 114 are as described above with reference to FIGS. 4 and 5. If the thickness of the housing 82 is less than 15 mm, then a hole 152 can be drilled through the housing 82 at a desired position for a fastener 110, and an insert 150 can be installed in the hole 152 as described above with reference to FIG. 6. However, the main difference between the embodiments shown in FIGS. 4-6 and this embodiment in FIG. 11 is that the groove 120 is positioned adjacent the edge 148 along the perimeter of the panel 80 even at the fastener positions. In FIGS. 4-6, the fasteners 110 were positioned between the seal 122 and the edge 148, which is preferred for a purged volume. However, in this configuration, the seal 122 is positioned between the fastener 110 and the edge 148 because the embodiment of this enclosure 100 can have an unpurged volume in its interior 94. Therefore, it is not necessary to prevent pressure communication between the exterior 96 and the interior 94.

FIGS. 12A and 12B are perspective and detailed views of the bottom side of the panel 80. In this embodiment, fasteners 110, washers 112, and bushings 114 are installed at the holes 116, a resilient seal 122 is installed in the groove 120, and handle inserts 166, 168 are installed in the insert holes 162, 164, respectively. The FIG. 12B clearly shows the path of the groove 120 and seal 122 along the perimeter of the panel 80 with the fasteners 110 positioned on an opposite side of the seal 122 from the edge 148. Alignment holes 170 can also be included in this configuration.

Figure 13B:
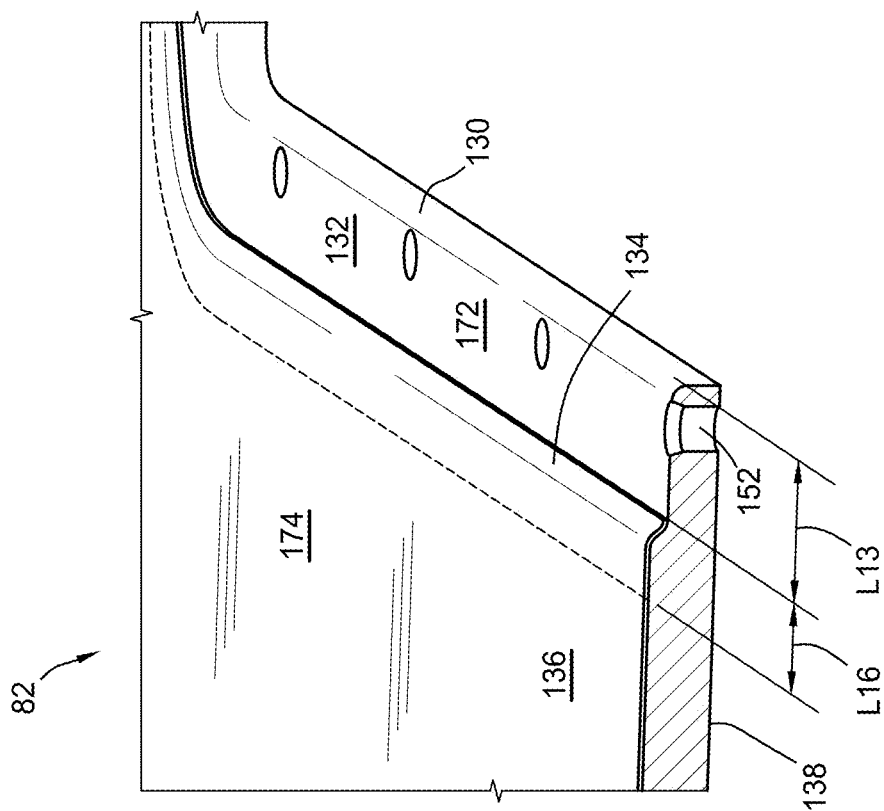
FIGS. 13A, 13B are representative perspective views of a portion of the housing shown in FIG. 3, in accordance with certain embodiments.
Figure 13A:
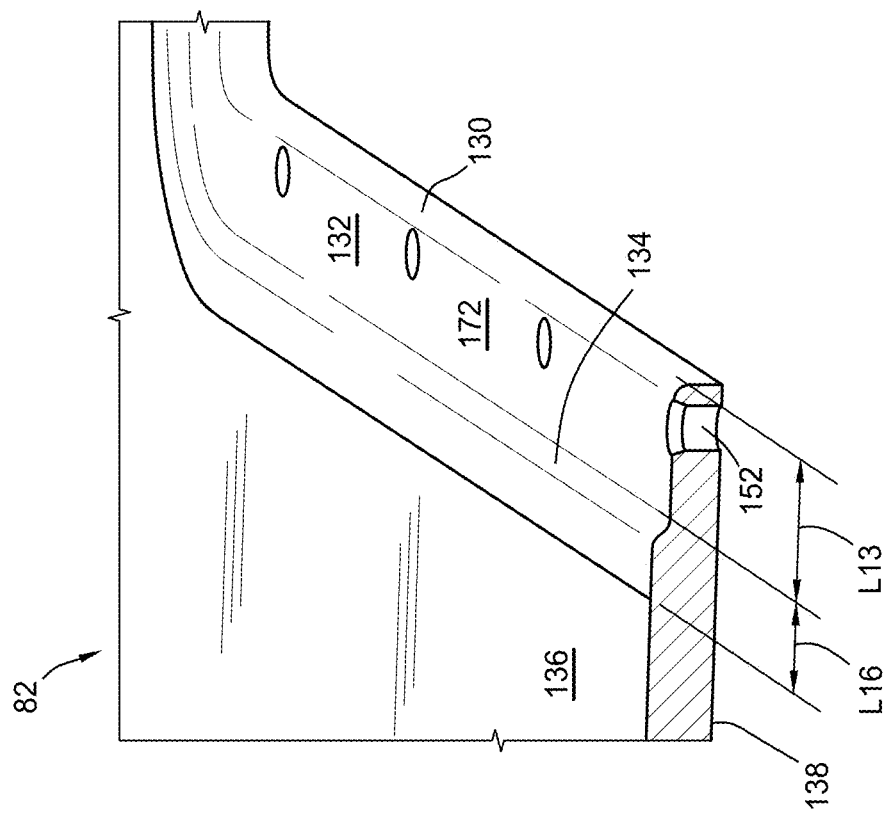

FIG. 13A shows a portion of the housing 82 after a metallization process is complete that can produce a layer 172 of aluminum that can cover the edge 130, the flange surface 132, the transition surface 134, and a portion of the surface 136 around the perimeter of the opening in the housing 82. The aluminum layer 172 extends a distance of L13 from the edge 130 to the transition surface 134 and further can extend away from the transition surface covering a portion of the surface 136 by a distance of L16. The aluminum layer 172 can contact portions of surface 142 of the panel 80 when the panel 80 is attached to the housing 82, thereby electrically coupling the panel 80 with the housing 82 along the perimeter of the opening in the housing 82.

Please note that a hole 152 is shown in FIG. 13A which is used for flange 82b thicknesses of less than 15 mm. If the thickness of the flange 82b were 15 mm or larger, then a blind hole 117 could be drilled instead. However, it should be understood that a housing flange with a thickness of 15 mm or greater can be drilled to form a hole 152 into which an insert 150 can be installed. It is not required that a blind hole 117 be drilled in a housing flange with a thickness of 15 mm or greater.

FIG. 13B shows a portion of the housing 82 after a painting process is complete. The housing surfaces 136, 134, and 138 are painted with a corrosion resistant paint 174. The paint can overlap the metalized aluminum layer 172 by a distance of L16 from the surface 132, which covers the portion of the aluminum layer 172 on the top surface 136 as well as the portion of the aluminum layer 172 on the transition surface 134. This overlapping of the paint with the aluminum layer can ensure a corrosion resistant barrier between the steel material of the housing 82 and the panel 80 as well as environmental conditions.

FIG. 14 shows a portion of another housing 82 a painting process is complete. This housing 82 has a flange thickness of 15 mm or greater with a blind hole 117 formed in the flange 82b. The aluminum layer 172 covers the edge 130, the flange surface 132, the transition surface 134 and a distance of L16 of the surface 136. The surfaces 136 and 138 are then painted with the paint 174 to further protect the housing 82 from corrosion.

Figure 15:
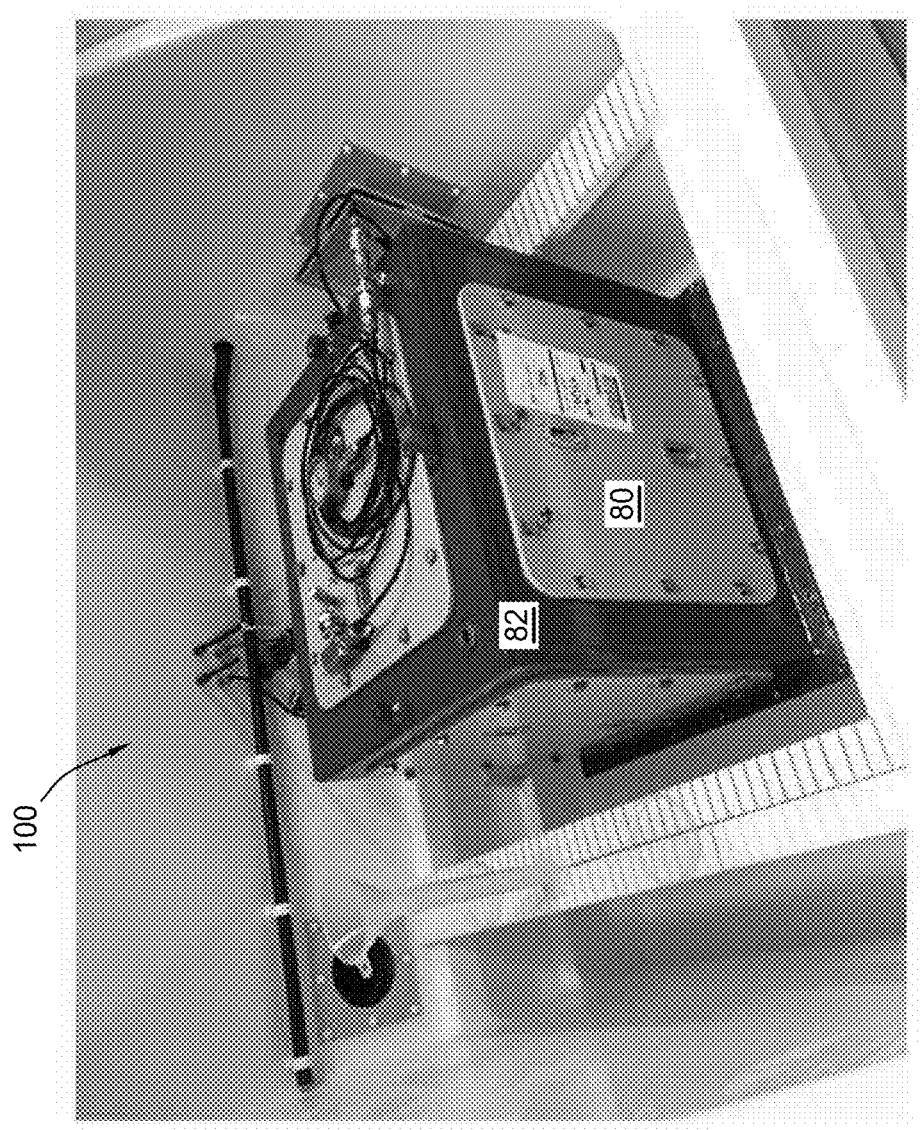
FIG. 15 is representative perspective view of an enclosure, in accordance with certain embodiments, in a salt spray test environment.

FIG. 15 shows a representative enclosure 100, according to some embodiments, with multiple panels 80 removably attached to a housing 82. The test setup provides connections to pressurize the interior of the enclosure 100 before, during, and/or after the testing. The enclosure 100 is fitted into an open chamber, where salt spray can be continuously applied to the enclosure to accelerate development of corrosion in or on the enclosure 100. During this salt spray testing example, the enclosure 100 was subjected to 2 milliliters per hour (ml/h) spray of a saltwater solution for 96 hours at a temperature of 35 degrees Celsius. FIGS. 16A-20 show pictorial results of the condition of various components of the enclosure 100 after the salt spray testing was completed.

Figure 16C:
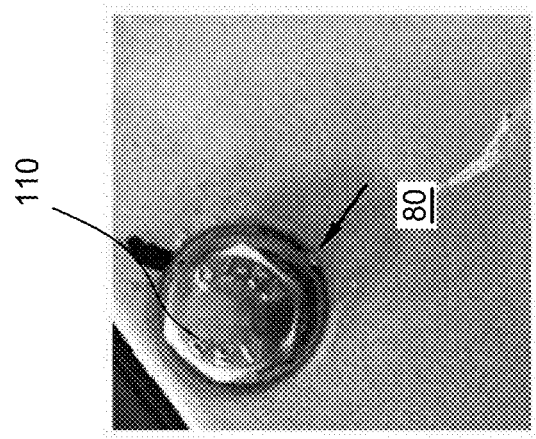
FIGS. 16A-16C are representative views of minor corrosion around fasteners securing the panel to a housing of an enclosure, in accordance with certain embodiments, after completion of a salt spray test.
Figure 16B:
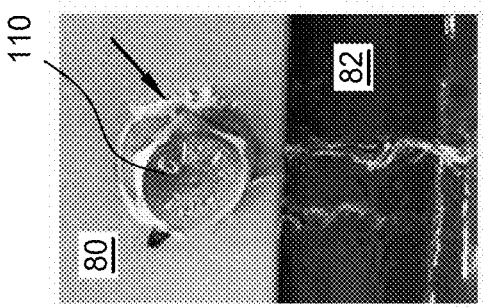
Figure 16A:
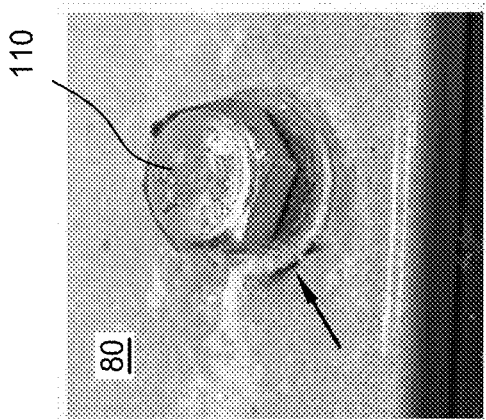

FIGS. 16A-16C show fastener 110 locations on the panel 80 that have a slight amount of corrosion at the captive bushing for the fasteners 110.

Figure 17:
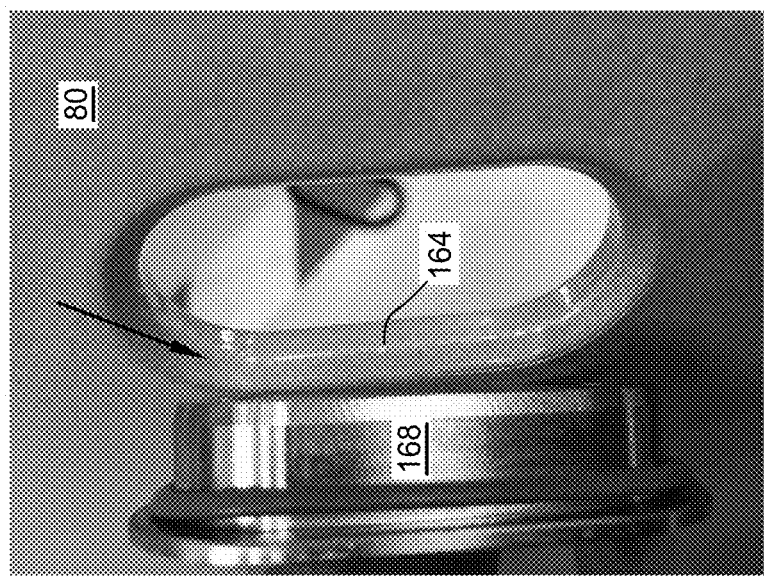
FIG. 17 is a representative view of a handle insert and its mounting hole in a panel of an enclosure, in accordance with certain embodiments, after completion of a salt spray test.

FIG. 17 shows a handle insert 168 removed from its respective mounting hole 164, where there is no noticeable corrosion damage to the panel 80 in this area.

Figure 18:
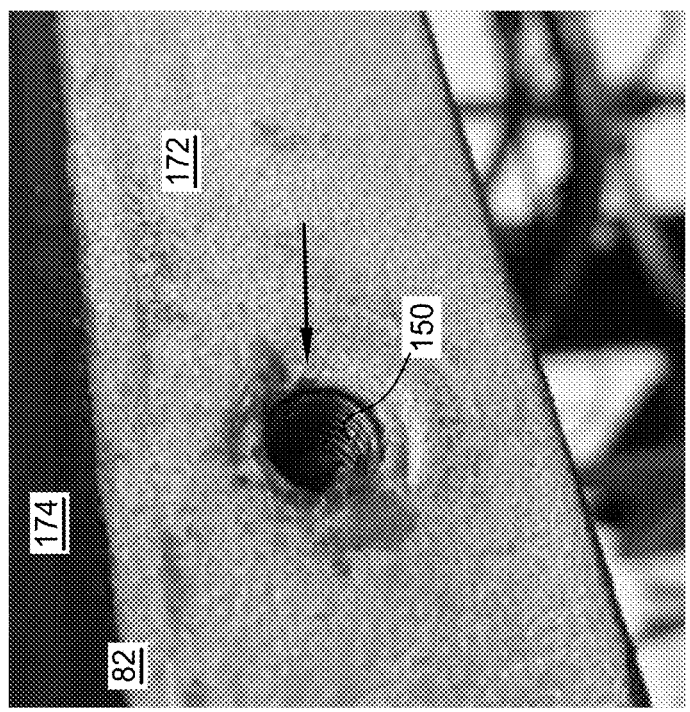
FIG. 18 is a representative view of a threaded insert mounted in a flange of a housing of an enclosure, in accordance with certain embodiments, after completion of a salt spray test with a panel removed from the housing.

FIG. 18 shows a threaded insert 150 installed in a flange of the housing 82. The flange is metalized forming an aluminum layer 172. There is no noticeable corrosion damage to the housing 82 or the area around the insert 150.

Figure 19:
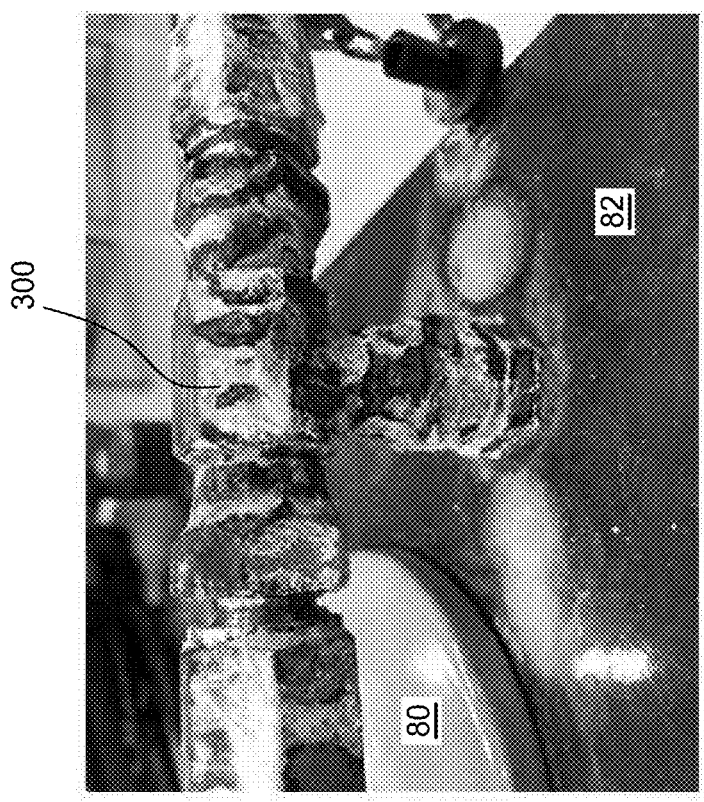
FIG. 19 is a representative view of standard fittings used during testing that are subjected to a salt spray test with the enclosure, which is in accordance with certain embodiments.

FIG. 19 shows standard non-stainless steel fittings 300 used to connect the housing to a compressed air source for pressurizing the interior 94 of the housing 82. This provides a reference to the enclosure 100 as to the amount of corrosion that may be experienced by components in the salt spray test example if not processed in keeping with the principles of this disclosure. As can be seen, significant and visible corrosion has occurred to these standard fittings 300 as a result of the salt spray testing.

Figure 20:
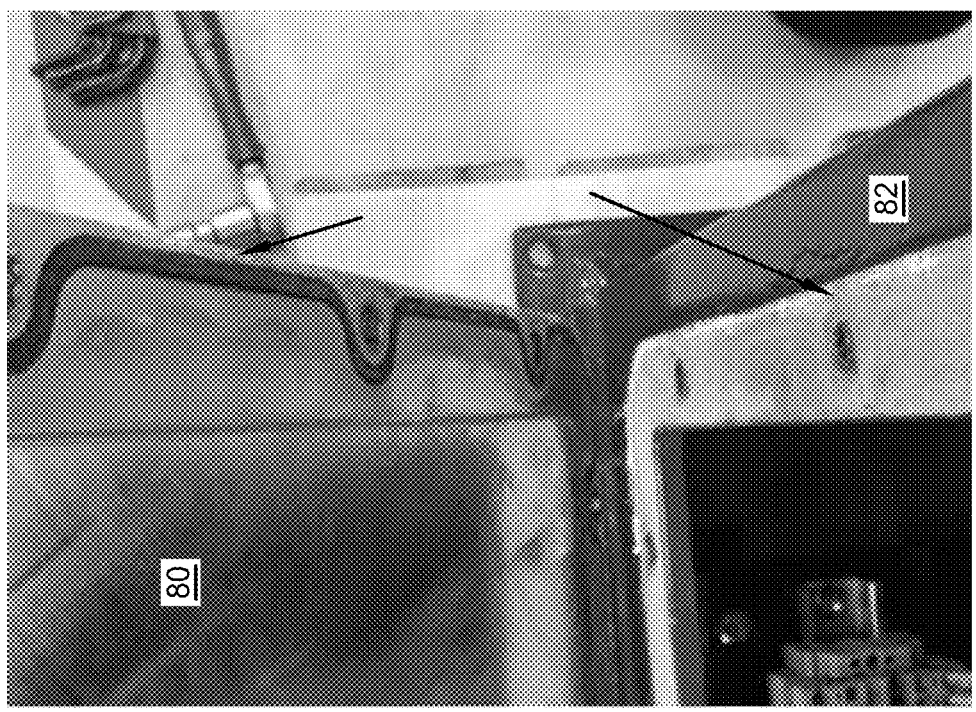
FIG. 20 is a representative view of a panel removed from a housing of an enclosure, in accordance with certain embodiments, after completion of a salt spray test.

FIG. 20 shows a panel 80 removed from the housing 82 after the salt spray testing is complete. Minor corrosion can be seen at the edge of the panel 80 and the edge of the metallization on the flange of the housing 82 near the painted surface.

Figure 21:
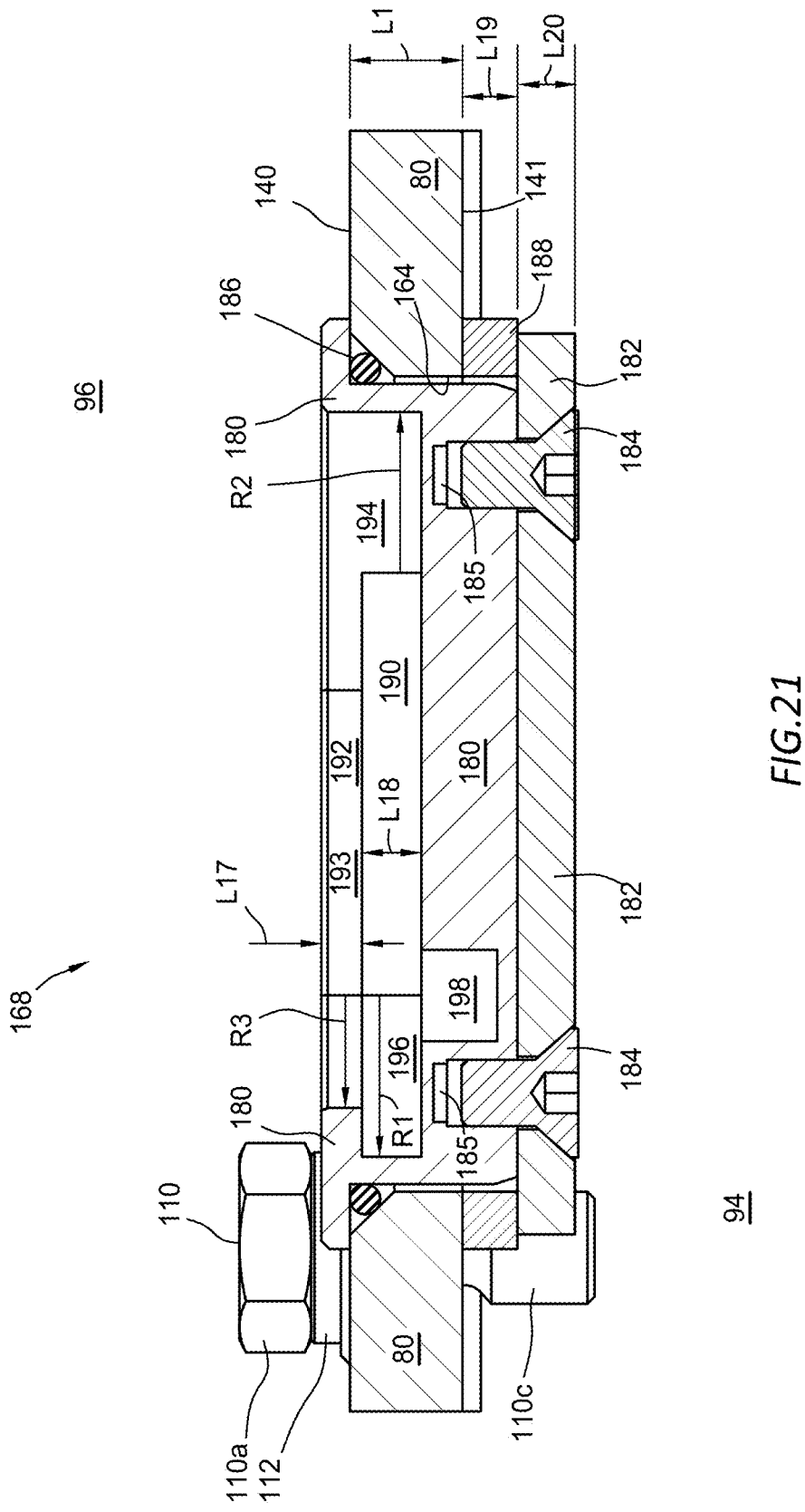
FIG. 21 is a representative cross-sectional view along section line 21-21, as indicated in FIG. 8, of a handle latch insert in a panel, in accordance with certain embodiments.

FIG. 21 shows a representative cross-sectional view along section line 21-21, as indicated in FIG. 8, of the handle insert 168 installed in the hole 164, which can be representative of a handle insert 166 installed in a hole 162. The handle insert 168 can include a top portion 180, a bottom portion 182, and a spacer 188. The top portion 180 is installed in the insert hole 164 from the side of the panel 80 having the top surface 140. The hole 164 can be chamfered around its perimeter at the top surface 140 to allow space for a seal 186 when the top portion 180 is installed in the hole 164. The seal 186 can engage the top portion 180 and the chamfered edge of the hole 164 to prevent ingress of fluids from the exterior 96 to the interior 94 when the panel 80 is attached to the housing 82. The top portion 180 can extend through the hole 164 were the bottom portion 182 can be removably attached to the top portion 180 by fasteners 184 installed through holes in the bottom portion 182 into blind holes 185 in the top portion 180. The bottom portion 182 can have a thickness of L20 and provide sufficient structure to secure the handle insert 168 in the hole 164 and compress the seal 186. A spacer 188 can be positioned between the bottom portion 182 and the bottom surface 141 of the panel 80 to accommodate various thicknesses L1 of the panel 80. The top and bottom portions 180, 182 of the insert 166, 168, and the spacer 188 can be electrically coupled to the bottom surface 141 of the panel 80 through contact of the spacer 188 to the bottom surface 141, and the contact of the bottom portion 182 to the spacer 188. The spacer 188 can have a thickness L19 that provides adequate compression of the seal 186 to ensure sealing between the handle insert 168 and the panel 80. Please note that the fastener 110 shown in the cross-section is merely in the background. It is not part of the insert 168.

A handle 200 (see FIG. 22) can be installed in the inserts 166, 168 by inserting a round disk at the bottom of each handle 200 end through a circular entry 194 of the inserts 166, 168, respectively. The insert 168 can have an elongated slot 190 with rounded ends having radii R1 or R2 (which can be the same radius). The elongated slot 190 has a circular entry point 194 that can receive the circular disk portion at the bottom of the handle 200 end. The slot 190 extends from the entry 194 of radius R2 as a constant slot width (i.e. width=R2*2) to a rounded end 196 with a radius of R2. The circular disk of the handle can be inserted in the entry 194 and moved along the elongated slot 190 to bump up against the rounded end 196. The diameter of the handle's circular disk is larger than a slot 193 of width L24 (see FIG. 8) which is formed by two protrusions 192 with thicknesses of L17. These protrusions 192 can extend toward the center of the insert 168 from opposite sides of the insert. The end of the slot 193 can be rounded with radius R3. Slot width L24 can be equal to R3 times 2. The other end of the slot 193 is open to allow the circular disk of the handle to be removed from or inserted into the elongated slot 190. When the circular disk of the handle is moved to the end of the slot 190, then a protrusion can be extended into the recess 198 to prevent the handle 200 from being removed from the insert 168.

Figure 22:
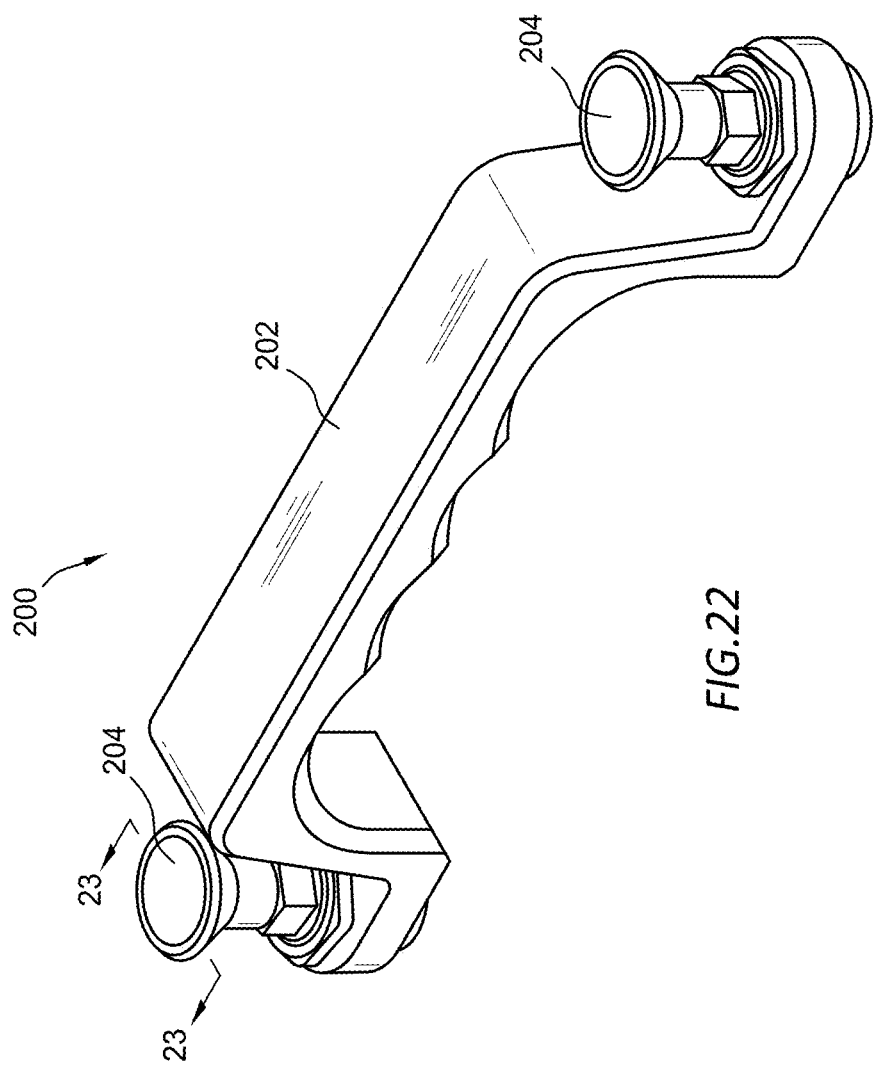
FIG. 22 is a representative perspective view of a detachable handle that can be removably attached to a panel such as the one in FIG. 8, in accordance with certain embodiments.

FIG. 22 shows a representative perspective view of the handle 200 with a body 202 and a latch 204 at each end. The handle 200 can be engage the handle inserts 166, 168 and the latches 204 can prevent disengagement of the handle 200 from the inserts 166, 168.

Figure 23:
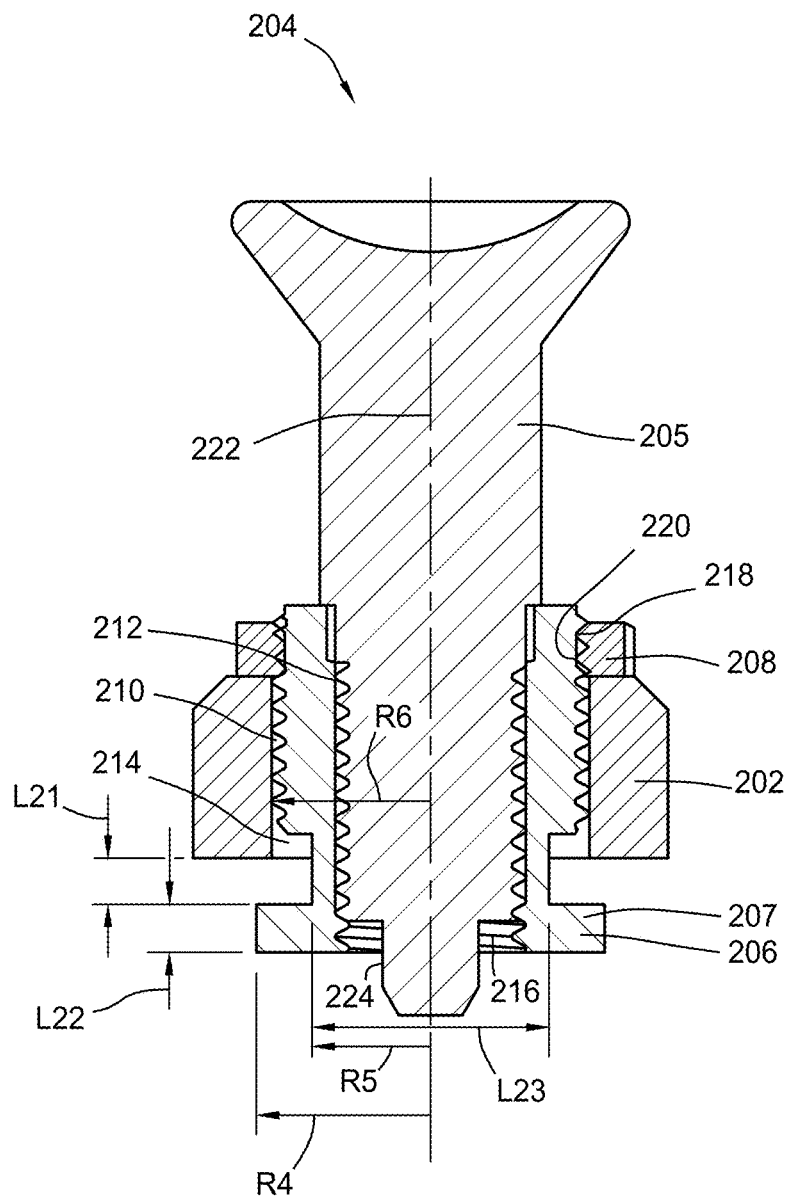
FIG. 23 is a representative cross-sectional view along section line 23-23 of an end of the handle latch shown in FIG. 22, in accordance with certain embodiments.

FIG. 23 shows a representative cross-section view along section line 23-23, as indicated in FIG. 22, of a latch 204 of the handle 200. The latch 204 can include a rotatable body 205, an adjustable structure 206, a nut 208, and a central axis 222 about which the body 205 can rotate. The adjustable structure 206 can include an internal threaded bore 216 which can engage external threads 212 on the body 205 when the body 205 is installed in the adjustable structure 206. The adjustable structure 206 can include external threads 218 which engage with threads 220 of the nut 208 when the nut 208 is screwed onto the top portion of the adjustable structure 206. The adjustable structure 206 can include a circular disk 207 at the bottom of the structure 206. The circular disk is spaced away from the handle body 202 to allow a clearance of L21 between the circular disk 207 and the handle body 202. The clearance L21 is larger than the thickness L17 of the protrusions 192 to allow for the handle to move along the slot 190 in the inserts 166, 168. This clearance L21 can be adjusted by screwing or unscrewing the nut 208 when the nut 208 is attached to the adjustable structure 206.

To assemble the handle latch 204, the adjustable structure 206 can be inserted from the bottom of the hole 214 of the handle body 202 until the top of the structure 206 protrudes above the top of the hole 214 where the nut 208 can be screwed onto the threads 218 of the structure 206. The nut 208 can be screwed onto the threads 218 until the desired clearance L21 is achieved. The body 205 can then be screwed into the top of the threaded bore 216 in the adjustable structure 206. The body 205 is initially screwed into the threaded bore 216 enough to secure the body 205 into the structure 206, but not enough to extend the protrusion 224 past the end of the adjustable structure 206. To install the handle 200 in the inserts 166, 168 each circular disk 207 of each latch 204 is inserted through the respective entry 194 in each insert 166, 168. The protrusion 224 is not extended past the end of the adjustable structure 206, so the circular disk 207 will bottom out in the slot 190 and can be moved along the elongated slot 190 to the end 196, where the circular disk 207 can abut the end 196 and position the protrusion 224 above the recess 198. The body 205 can then be rotated about the central axis 222 to extend the protrusion 224 into the recess 198, thereby preventing the circular disk 207 from moving back to the entry 194 and being released from the insert 166, 168. The protrusions 192 that form the slot 193, engage shoulders of the circular disk 207 to prevent removal of the handle 200 from the inserts 166, 168. The inserted and secured handle 200 can assist in manual manipulation of the panel 80 or tie-down points for the enclosure 100 or the robotic system that utilizes the enclosure. When the handle is no longer needed, the body 205 can be unscrewed to disengage the protrusion 224 from the recess 198, allowing the circular disk 207 to move back along the elongated slot 190 to the entry 194, thereby allowing the circular disk 207 to be removed from the inserts 166, 168 and freeing the handle 200 from the panel 80.

Figure 24A:
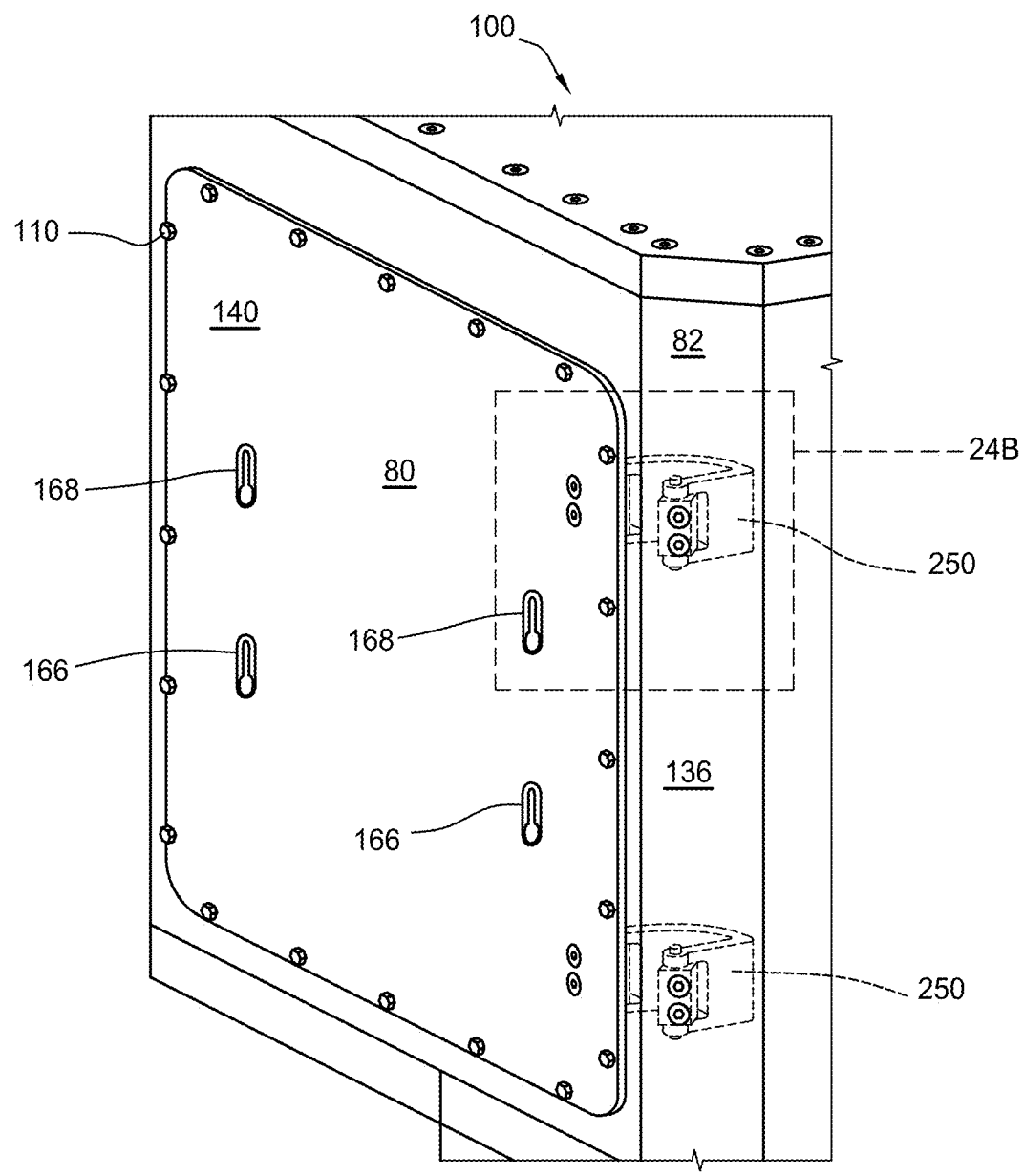
FIGS. 24A-24B are representative perspective and partially translucent views of an enclosure with hinges attached between a panel and a housing of the enclosure, in accordance with certain embodiments.

FIG. 24A shows a portion of an enclosure 100 with hinges 250 connected between a panel 80 and a housing 82. These hinges 250 allow the panel to be supported and rotated away from the housing opening that the panel 80 covers when the fasteners 110 of the panel 80 are disengaged from the housing 82. The panel 80 includes two sets of handle inserts 166, 168 that can support removable attachment of two handles 200 to the panel 80. The housing 82 in this figure has angled corners and the hinges 250 are attached at one end to the angled corner of the housing 82 and the other end to the panel 80. It should be understood, that, as in the previous embodiments of the housing, the corners can be right angles with the hinges 250 attached to a surface that is generally parallel with an interior surface 141 (not shown) of the panel 80.

Figure 24B:
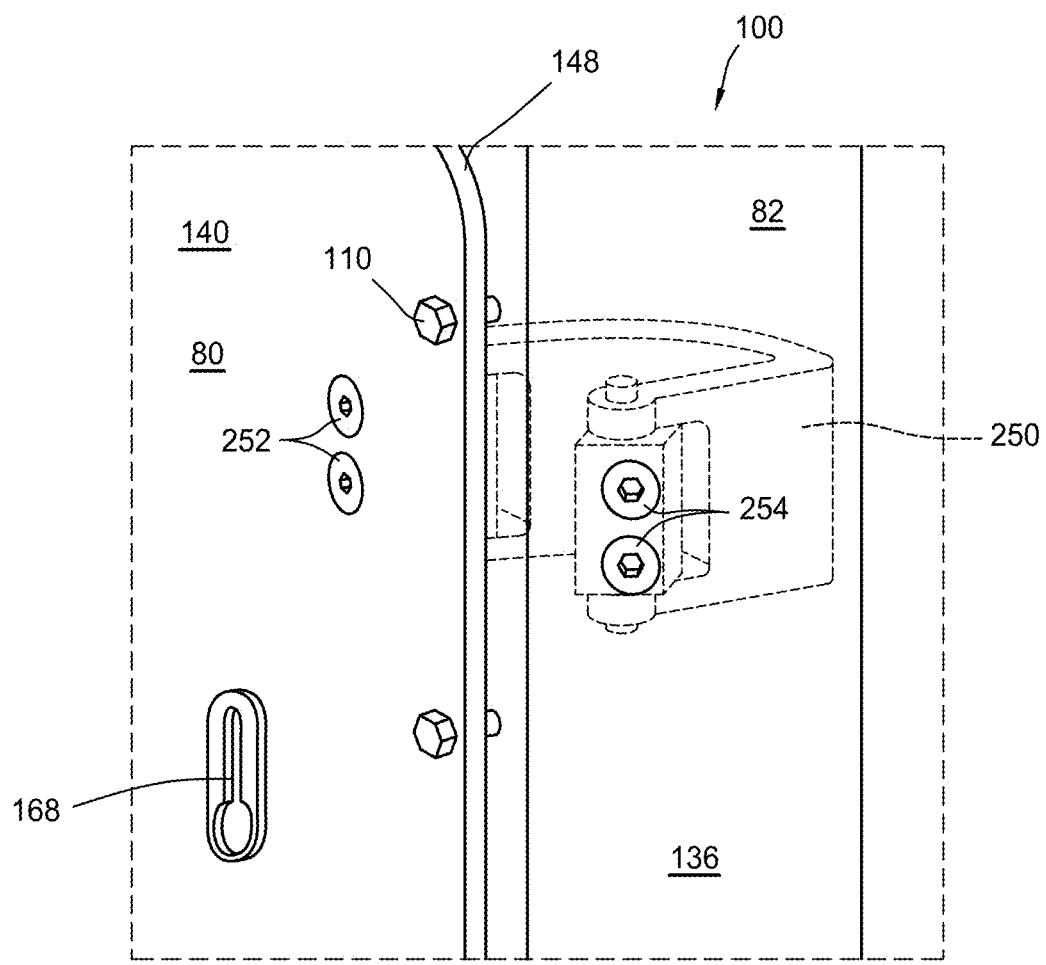

FIG. 24B is a detailed view of the area 24B indicated in FIG. 24A. The hinge 250 can be attached to the housing 82 and the panel 80 by various attachment methods, such as welding, bonding, etc. However, the preferred attachment method is to use threaded fasteners to attach the ends of the hinge 250 to the panel 80 and to the housing 82. Threaded fasteners 252 can be inserted through holes in the panel 80 and threadably engaged with the hinge 250, and threaded fasteners 254 can be inserted through holes in the housing 82 and threadably engaged with the hinge 250, to rotationally attach the panel 80 to the housing 82 via the hinge 250. As can be seen, the hinge 250 is installed to interior surfaces of the panel 80 and the housing 82. While this may be preferred, the hinges can also be installed to exterior surfaces of the panel 80 and the housing 82.

Figure 25:
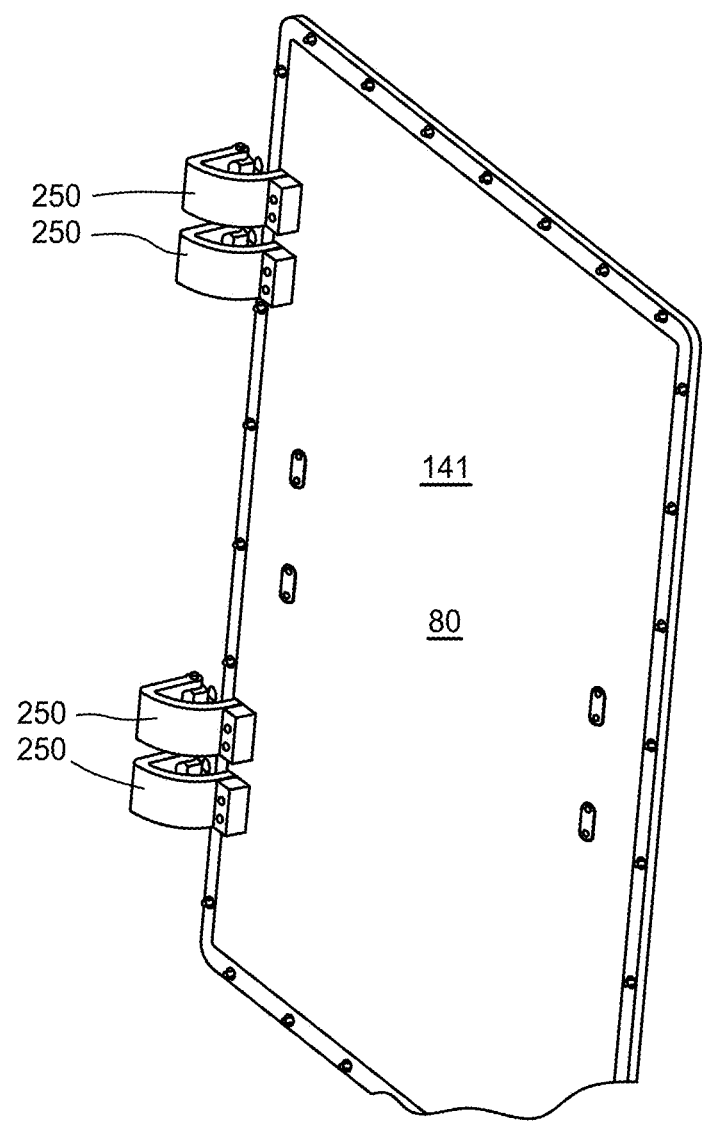
FIG. 25 is a representative perspective view of a panel with multiple hinges attached to a rear surface of the panel, in accordance with certain embodiments.

FIG. 25 shows another hinge configuration, with four hinges 250 attached to the interior surface 141 of the panel 80, with the other end of each hinge 250 attached to the housing 82 (not shown).

Figure 26B:
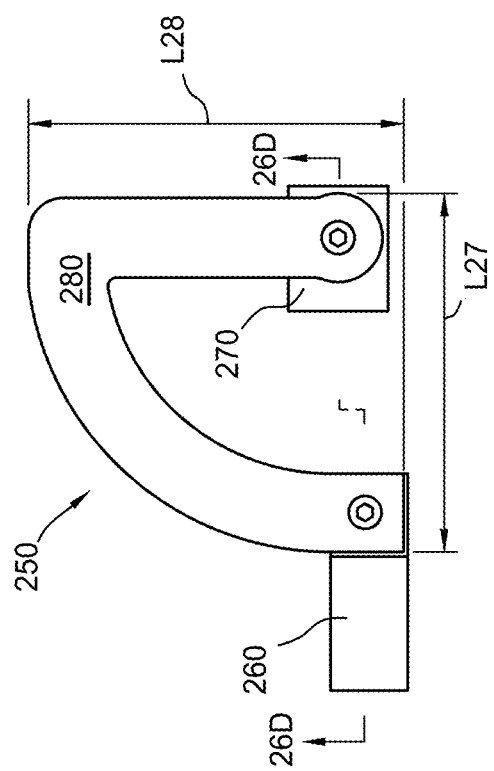
FIG. 26B is a representative side view of the hinge of FIG. 26A, in accordance with certain embodiments.
Figure 26D:
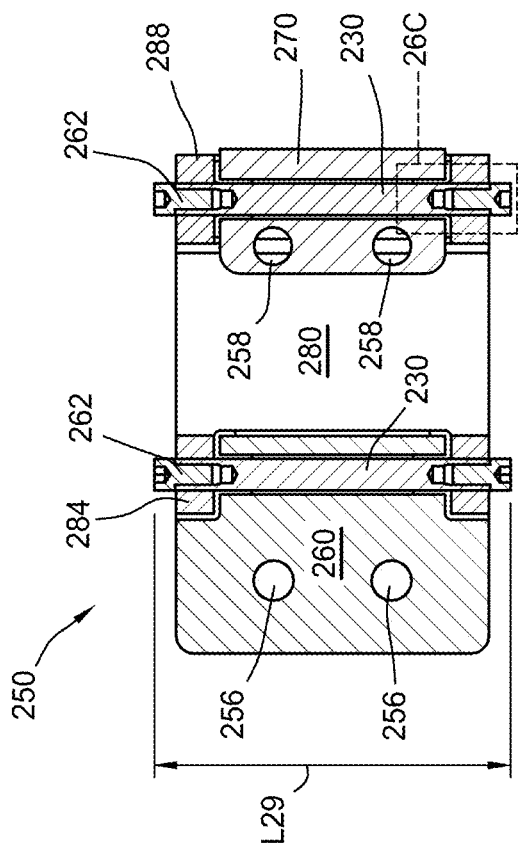
FIG. 26D is a representative cross-sectional view along section line A-A, indicated in FIG. 26B, in accordance with certain embodiments.
Figure 26A:
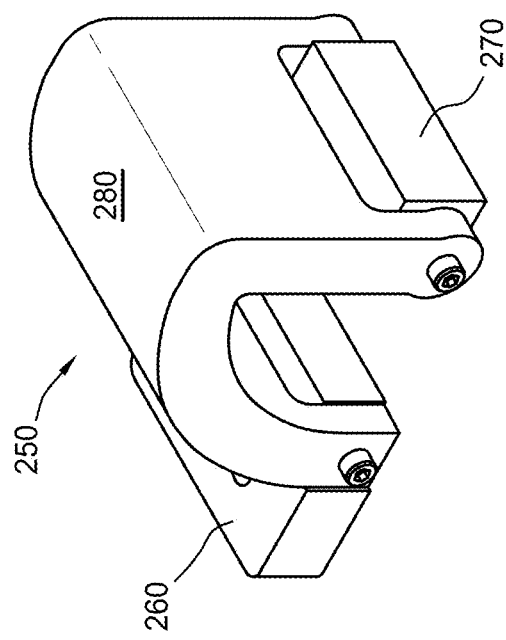
FIG. 26A is a representative perspective view of a hinge, in accordance with certain embodiments.

FIGS. 26A-26D show various views of a hinge 250, according to some embodiments. FIG. 26A is a representative perspective view of the hinge 250. The hinge 250 can include a panel mounting bracket 260 that can be used to attach the hinge 250 to the panel 80 and a housing mounting bracket 270 that can be used to attach the hinge 250 to the housing 82. An arm 280 rotationally connects the bracket 260 to the bracket 270. The arm 280 can have a width L27 and a height L28, as shown in FIG. 26B. FIG. 26D is a representative cross-sectional view along section line A-A in FIG. 26B. The arm 280 can have a pair of extensions 284 that straddle the bracket 260, with each extension 284 having a hole that can receive a shaft 230. The shaft 230 can extend through one extension 284, through a hole in the mounting bracket 260, and then through the other extension 284. Each end of the shaft 230 can be threaded to receive a fastener 262 that can prevent the shaft 230 from being removed from the hinge 250. Similarly, the arm 280 can have a pair of extensions 288 that straddle the bracket 270, with each extension 288 having a hole that can receive a shaft 230. The shaft 230 can extend through one extension 288, through a hole in the mounting bracket 270, and then through the other extension 288. Each end of the shaft 230 can be threaded to receive a fastener 262 that can prevent the shaft 230 from being removed from the hinge 250. The mounting bracket 260 can include threaded holes 256 that threadably engage fasteners 252 when the mounting bracket 260 is attached to the panel 80. The width of the hinge 250, including the fasteners 262, can be width L29. The mounting bracket 270 can have threaded holes 258 that can threadably engage fasteners 254 when the mounting bracket 270 is attached to the housing 82.

Figure 26C:
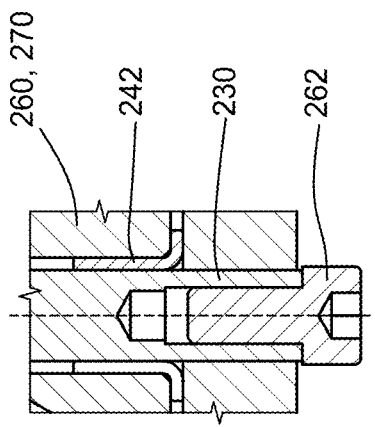
FIG. 26C is a representative detail cross-sectional view of the detail area 26C shown in FIG. 26D, in accordance with certain embodiments.

FIG. 26C is a detailed view of the area 26C in FIG. 26D and shows a threaded blind hole drilled in one end of the shaft 230. A fastener 262 can be installed in the end of the shaft 230 to keep the shaft 230 in the hinge 250. A bushing 242 can be used to reduce friction between the brackets 260, 270 when the shafts 230 rotate within the mounting brackets 260, 270.

Figure 27:
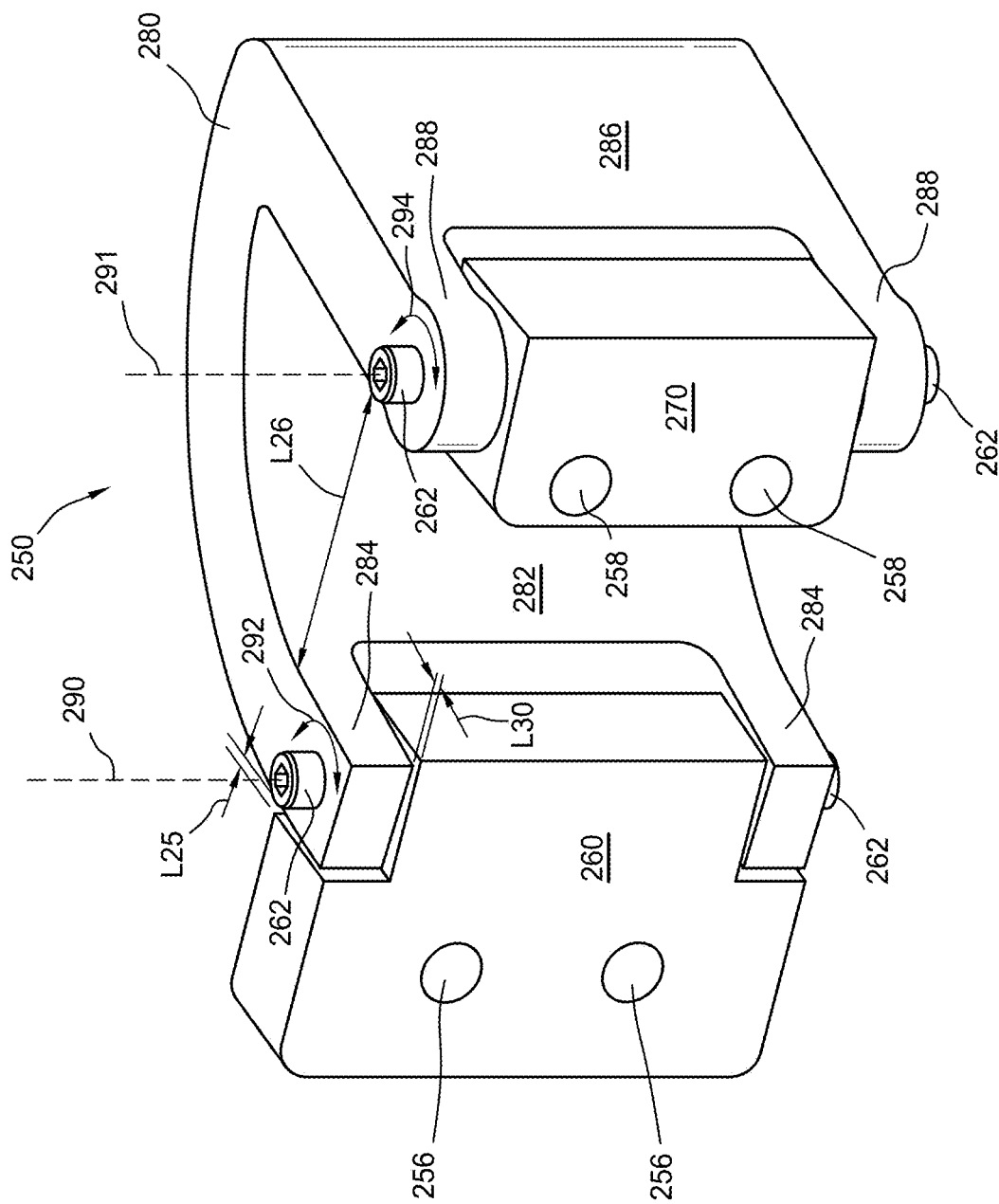
FIG. 27 is a representative perspective bottom view of a hinge, in accordance with certain embodiments.

FIG. 27 shows a representative perspective view of a hinge 250, according to one or more embodiments. The mounting bracket 260 can include threaded holes 256 which can receive the fasteners 252 to secure the mounting bracket 260 to the panel 80. The mounting bracket 270 can include threaded holes 258 which can receive the fasteners 254 to secure the mounting bracket 270 to the housing 82. The hinge 250 can include an arm 280 which can be rotationally attached to the mounting brackets 260, 270. The arm 280 can include a curved portion 282 and a lateral portion 286 which are joined at one end and each have a pair of extensions at another end. Width L26 is an internal width of the arm 280 that provides clearance needed to allow for the distance the panel 80 overlaps the housing 82. A pair of extensions 284 of the curved portion 282 can straddle a portion of the mounting bracket 260. A shaft 230 (see FIG. 26D) can be inserted, along the axis 290, through holes in the extensions 284 and a hole in the portion of the mounting bracket 260 to rotationally attach the extensions 284 to the mounting bracket 260. Fasteners 262 can be installed in each end of the shaft 230 to prevent the shaft 230 from being removed from the mounting bracket 260.

The extensions 284 can be rectangularly shaped such that, when the hinge 250 is installed between the panel 80 and the housing 82 and with the panel 80 closed, there is a gap L30 between the end of the extensions 284 and the panel 80 and a gap L25 between the edge of the extensions 284 and the mounting bracket 260. These gaps L25, L30 allow the arm 280 to rotate slightly about axis 290 (see arrows 292) relative to the mounting bracket 260. However, as shown in FIG. 27, when the arm 280 is rotated about the axis 290 and one or more of the gaps L25, L30 are reduced at or near zero "0", the extensions 284 can engage the mounting bracket 260 and prevent further rotation between the mounting bracket 260 and the arm 280 until the arm is rotated in an opposite direction. This can allow the panel 80, attached to the mounting bracket 260, to be lifted away from the housing 82 to disengage the seal 122 before rotating the panel 80 relative to the housing 82. Once the seal 122 is disengaged from the housing 82, the panel can be rotated away from the housing, via the hinges 250, allowing access to an opening in the housing 82.

The lateral portion 286 of the arm 280 can have a pair of extensions 288 at one end that straddle the mounting bracket 270. A shaft 230 (see FIG. 26D) can be installed through holes in the extensions 288 and a hole in the portion of the mounting bracket 270 along the axis 291 to rotationally attach the extensions 288 to the mounting bracket 270. Fasteners 262 can be installed in each end of the shaft 230 to prevent the shaft 230 from being removed from the mounting bracket 270. Each of the extensions 288 can have a rounded end that allows free rotation about the axis 291 (see arrows 294).

Figure 28:
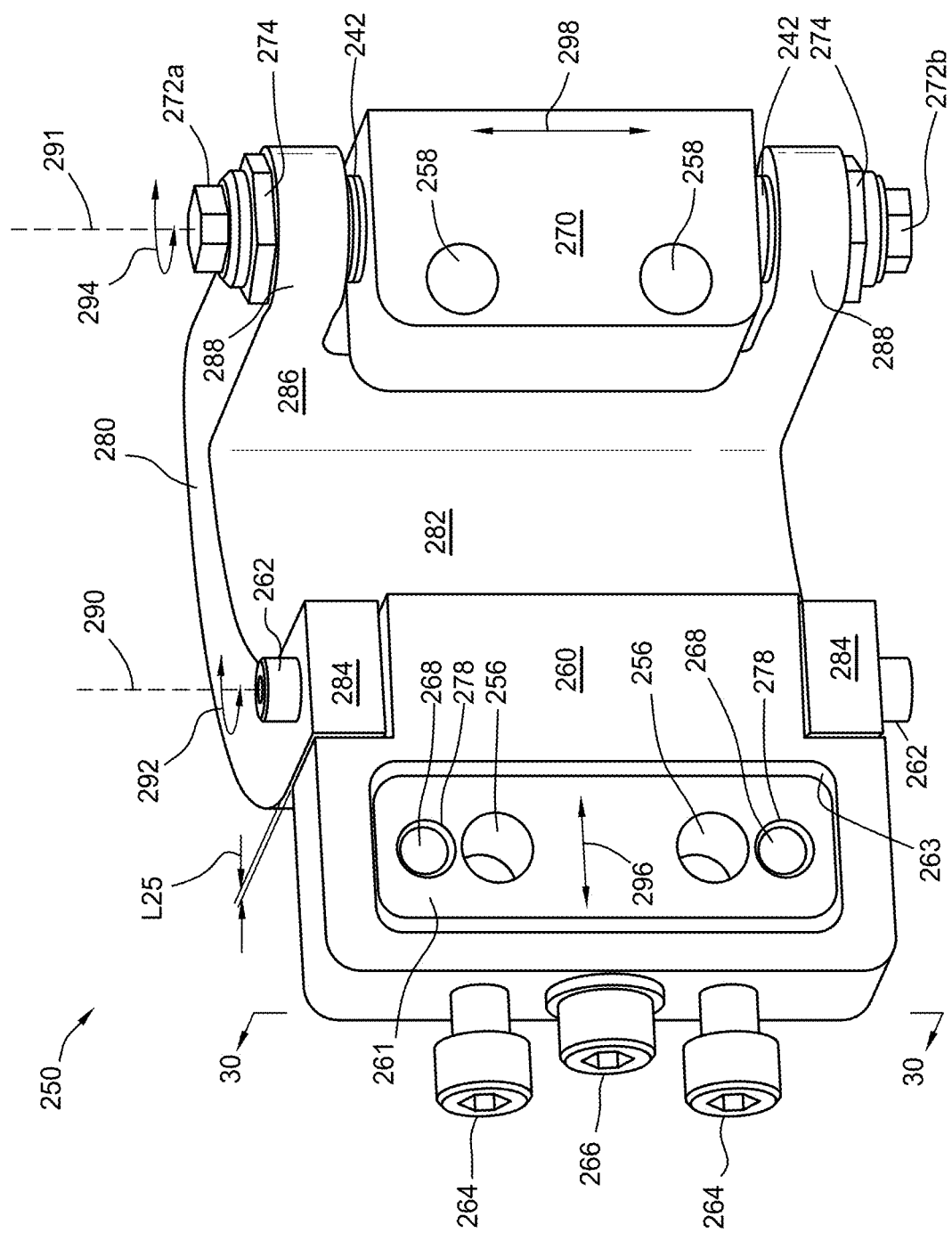
FIG. 28 is a representative perspective bottom view of an adjustable hinge, in accordance with certain embodiments.

FIG. 28 shows a representative perspective view of an adjustable hinge 250, according to one or more embodiments. The mounting bracket 260 can include threaded holes 256 which can receive the fasteners 252 to secure the mounting bracket 260 to the panel 80. The mounting bracket 270 can include threaded holes 258 which can receive the fasteners 254 to secure the mounting bracket 270 to the housing 82. The hinge 250 can include an arm 280 which can be rotationally attached to the mounting brackets 260, 270. The arm 280 can include a curved portion 282 and a lateral portion 286 which are joined at one end and each have a pair of extensions at another end. A pair of extensions 284 of the curved portion 282 can straddle a portion of the mounting bracket 260. A shaft 230 (see FIG. 26D) can be inserted, along the axis 290, in holes through the extensions 284 and in a hole in the portion of the mounting bracket 260 to rotationally attach the extensions 284 to the mounting bracket 260. Fasteners 262 can be installed in each end of the shaft 230 to prevent the shaft 230 from being removed from the mounting bracket 260.

The extensions 284 can be rectangularly shaped such that, when the hinge 250 is installed between the panel 80 and the housing 82 and with the panel 80 closed, there is a gap L30 between the end of the extensions 284 and the panel 80 and a gap L25 between an edge of the extensions 284 and the mounting bracket 260. These gaps L25, L30 allow the arm 280 to rotate slightly about axis 290 (see arrows 292) relative to the mounting bracket 260. However, as shown in FIG. 27, when the arm 280 is rotated about the axis 290 and one or more of the gaps L25, L30 are reduced at or near zero "0", the extensions 284 can engage the mounting bracket 260 and prevent further rotation between the mounting bracket 260 and the arm 280 until the arm is rotated in an opposite direction. This can allow the panel 80, attached to the mounting bracket 260, to be lifted away from the housing 82 to disengage the seal 122 before rotating the panel 80 relative to the housing 82. Once the seal 122 is disengaged from the housing 82, the panel can be rotated away from the housing, via the hinges 250, allowing access to an opening in the housing 82.

In this adjustable configuration, the hinge 250 can include a mounting bracket 260 with a recess 263 into which an insert 261 can be positioned. There is a gap between the sides of the insert 261 and walls of the recess 263 to allow for left and right adjustments of the hinge 280 relative to the insert 261 as shown by arrows 296. Fasteners 268 can be screwed into threaded holes 278, and a fastener 266 can be screwed into the insert 261 through a side of the mounting bracket 260 to secure the insert 261 into the recess 263. With the fasteners 268 loose, the fastener 266 can be rotated to adjust a position of the insert 261 within the recess 263. Once the desired left/right position of the insert 261 in the recess 263 is achieved, then the fasteners 268 can be tightened and set fasteners 264 screwed into engagement with the insert 261 to further secure the insert. The set fasteners 266 can be screwed through threaded holes in the side of the mounting bracket 260 to engage a side of the insert, thereby applying a rightward acting force on the insert 261 while the fastener 266 applies an opposite leftward force on the insert 261. The fasteners 268 can be inserted through slotted holes in the mounting bracket 260 to allow for left and right movement of the insert 261 in the recess 263.

The lateral portion 286 of the arm 280 can have a pair of extensions 288 at one end that straddle the mounting bracket 270. In this configuration, a shaft 230 is not used to rotationally attach the extensions 288 to the mounting bracket 270. Alternatively, threaded pins 272a,b can be used to rotationally attach extensions 288 to the mounting bracket 270 and provide up and down adjustments between the arm 280 and the mounting bracket 270 as indicated by arrows 298. The threaded pin 272a can be rotated counterclockwise and the threaded pin 272b rotated clockwise to adjust the mounting bracket 270 "up" relative to the arm 280 (see arrows 298 which indicate up and down). The threaded pin 272a can be rotated clockwise and the threaded pin 272b rotated counterclockwise to adjust the mounting bracket 270 "down" relative to the arm 280. Alternatively, the fasteners 272a,b and extensions 288 can be configured such that opposite rotation of the fasteners 272a,b can adjust the mounting bracket 270 up or down. Therefore, the threaded pin 272a can be rotated clockwise and the threaded pin 272b rotated counterclockwise to adjust the mounting bracket 270 "up" relative to the arm 280. The threaded pin 272a can be rotated counterclockwise and the threaded pin 272b rotated clockwise to adjust the mounting bracket 270 "down" relative to the arm 280. Therefore, various thread configurations of the fasteners 272a,b and extensions 288 can be utilized as long as the rotation of the pins 272a,b can adjust the mounting bracket 270 "up" or "down" relative to the extensions 288.

Bushings 242 can be used to reduce friction between the pins 272a,b and the mounting bracket 270. When the desired position of the mounting bracket 270 relative to the arm 280 is achieved, then set nuts 274 can be tightened to prevent (or at least minimize) further rotation of the pins 272a,b. Each of the extensions 288 can have a rounded end that allows free rotation about the axis 291 (see arrows 294).

Figure 29:
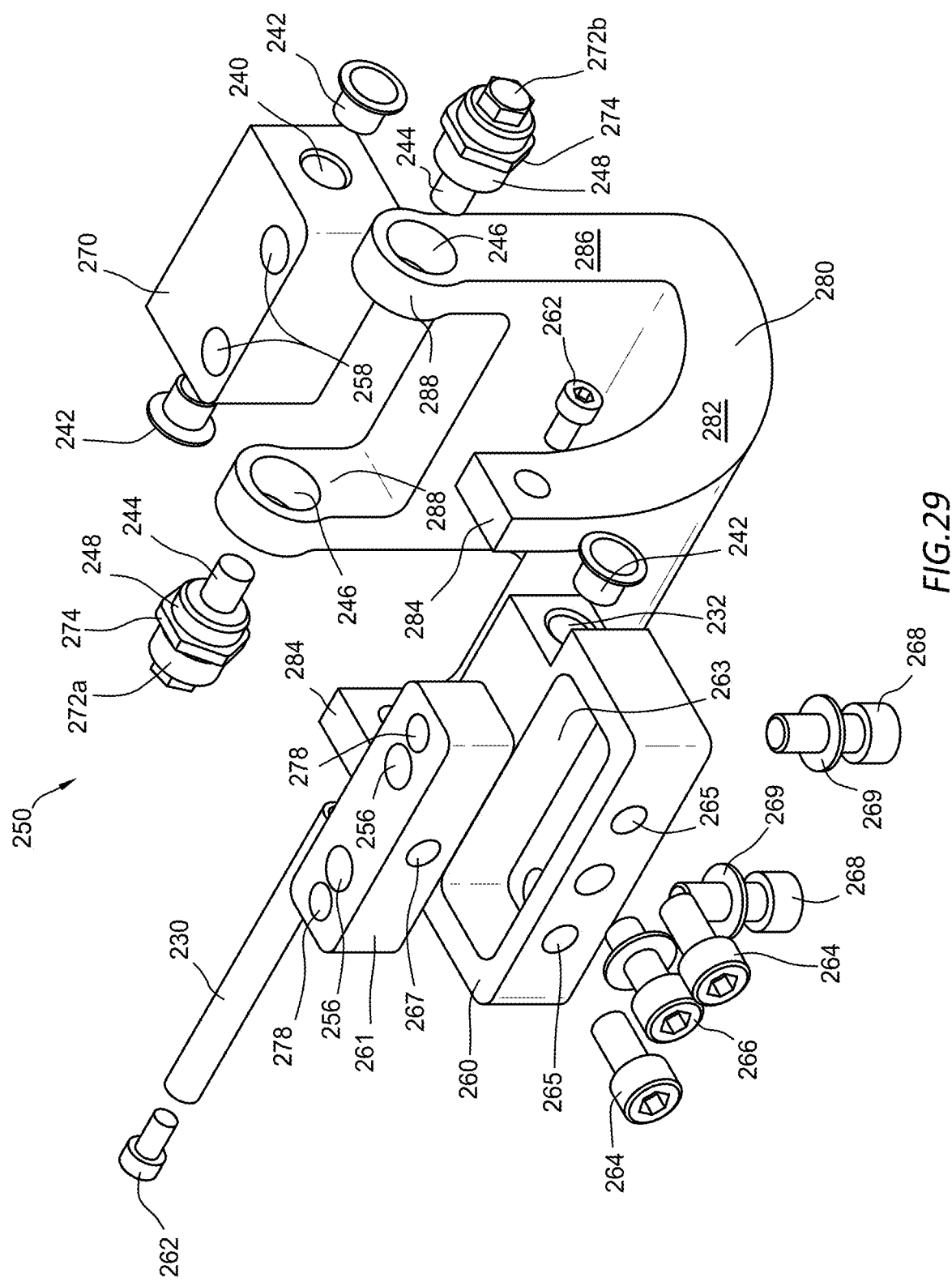
FIG. 29 is a representative perspective exploded view of the adjustable hinge of FIG. 28, in accordance with certain embodiments.

FIG. 29 shows a perspective exploded view of the adjustable hinge 250 shown in FIG. 28. The shaft 230 can be installed through the holes in the extensions 284 and the hole 232 in the mounting bracket 260. Bushing 242 can be installed between the shaft 230 and the mounting bracket 260 to reduce rotational friction. Fasteners 262 can be installed on each end of the shaft 230 to retain the shaft in the hinge 250. The insert 261 can be installed in the recess 263 with fasteners 268 (and optional washers 269) installed through slotted holes 276 (see FIG. 30) of the mounting bracket 260 into threaded holes 278 of the insert 261. The threaded holes 256 can receive fasteners 252 to attach the mounting bracket 260 to the panel 80. A fastener 266 (and optional washer) can be installed though a hole in the side of the mounting bracket 260 and into the threaded hole 267 in the insert. The set fasteners 264 can be installed in threaded holes 265 in the side of the mounting bracket 260 and used to engage the insert 261 to lock the insert 261 in a desired position. The mounting bracket 270 can be positioned between the extensions 288 with bushing 242 installed in each end of the through bore 240 in the mounting bracket 270. The pins 272a,b, with external threads 248 can be screwed into threaded holes 246 in the extensions 288 to engage a protrusion 244 with the bushing 242, thereby rotationally attaching the mounting bracket 270 to the extensions 288. Set nuts 274 can be installed to lock the pins 272a,b in position, thereby locking the mounting bracket 270 in a desired position.

Figure 30:
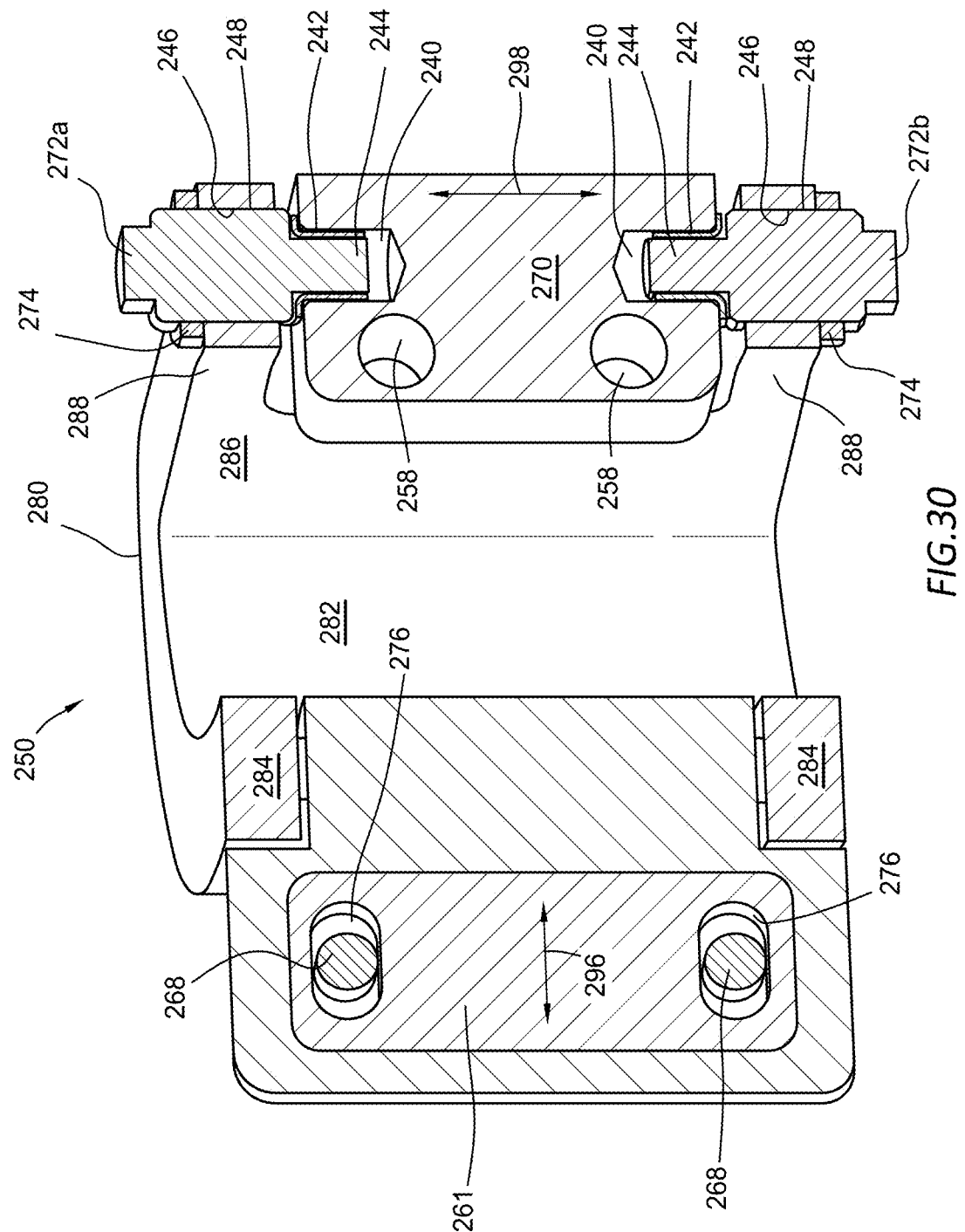
FIG. 30 is a representative cross-sectional perspective bottom view of another hinge, in accordance with certain embodiments.

FIG. 30 shows a representative cross-sectional view of the adjustable hinge of FIG. 28 as viewed along section line 29-29 indicated in FIG. 28, according to one or more embodiments. This figure clearly illustrates the slotted holes 276 in the mounting bracket 260 with fasteners 268 installed, which allows left and right movement of the insert 261 when the insert 261 is installed in the recess 263. This figure also clearly illustrates the adjustable mounting bracket 270 components. Each threaded pin 272a,b can be screwed into a threaded hole 246 in an extension 288 which engages a protrusion 244 with a bushing 244 that is installed in a blind hole 240. By rotating the pins 272a,b as described above, the mounting bracket 270 can be adjusted "up" or "down" relative to the arm 280. When the desired position of the mounting bracket 270 is achieved, the set nuts 274 can be tightened to lock the mounting bracket 270 in the desired position.

EMBODIMENTS

Embodiment 1

A system for conducting subterranean operations comprising: a robotic system comprising an enclosure and a robot, the robotic system configured to be ATEX certified or IECEx certified according to EX Zone 1 requirements, and the enclosure having a corrosion rate of less than 170 micrometers per year (micron/yr).

Embodiment 2

The system of embodiment 1, wherein the corrosion rate of the enclosure is less than 165 micron/yr, less than 160 micron/yr, less than 150 micron/yr, less than 140 micron/yr, less than 130 micron/yr, less than 120 micron/yr, less than 110 micron/yr, less than 100 micron/yr, less than 90 micron/yr, less than 80 micron/yr, less than 70 micron/yr, less than 60 micron/yr, less than 50 micron/yr, less than 40 micron/yr, less than 30 micron/yr, less than 20 micron/yr, less than 10 micron/yr, less than 5 micron/yr, less than 3 micron/yr, or less than 1 micron/yr.

Embodiment 3

The system of embodiment 1, wherein the enclosure contains electrical components within an interior of the enclosure.

Embodiment 4

The system of embodiment 3, wherein the enclosure is integral with the robot.

Embodiment 5

The system of embodiment 4, wherein the enclosure contains one or more controllers that control some of the robotic system.

Embodiment 6

The system of embodiment 5, wherein at least one of the one or more controllers is an electronic controller.

Embodiment 7

The system of embodiment 1, wherein the enclosure further comprises:
a panel with a panel flange adjacent an edge of the panel; and
a housing with a housing flange adjacent a perimeter of an opening in the housing, wherein the panel is removably attached to the housing and is configured to cover the opening when the panel is attached to the housing.

Embodiment 8

The system of embodiment 7, wherein a seal element in the panel flange sealingly engages the housing flange when the panel is attached to the housing.

Embodiment 9

The system of embodiment 8, wherein the panel flange is electrically coupled to the housing flange when the panel is attached to the housing.

Embodiment 10

The system of embodiment 9, wherein the panel is aluminum with a top surface and edge of the panel painted with a corrosion resistant paint, while a bottom surface, at least at the panel flange, of the aluminum is exposed aluminum,
wherein the housing includes a metallized layer of aluminum that covers the edge of the housing, the housing flange, and a portion of a top surface of the housing that is adjacent to the housing flange,
wherein a bottom surface of the housing and a portion of the top surface of the housing, excluding the housing flange, is painted with a corrosion resistant paint,
wherein the corrosion resistant paint overlaps the portion of the top surface of the housing adjacent the housing flange, and
wherein when the panel is attached to the housing, the exposed aluminum of the panel flange is electrically coupled to the aluminum layer on the housing flange.

Embodiment 11

The system of embodiment 8, wherein multiple first holes are spaced along the panel flange, and a groove is formed in the panel flange with the seal element disposed in the groove, and wherein the seal element is spaced away from the first holes.

Embodiment 12

The system of embodiment 11, wherein the seal element engages the panel flange and the housing flange when the panel is attached to the housing.

Embodiment 13

The system of embodiment 11, wherein the multiple first holes are disposed between an edge of the panel and the seal element.

Embodiment 14

The system of embodiment 11, wherein the seal element is disposed between an edge of the panel and the multiple first holes.

Embodiment 15

The system of embodiment 11, wherein multiple second holes are spaced along the housing flange, and wherein one of multiple fasteners is installed in each of the multiple first holes in the panel flange and engages respective ones of the second holes in the housing flange when the panel is attached to the housing.

Embodiment 16

The system of embodiment 15, wherein captive inserts are installed in each of the multiple first holes in the panel flange, and wherein the fasteners are held captive by the captive inserts when the fasteners are installed in the captive inserts.

Embodiment 17

The system of embodiment 15, wherein the multiple second holes are blind holes with internal threads, and wherein the fasteners are configured to threadably engage the internal threads.

Embodiment 18

The system of embodiment 17, wherein the blind holes contain a lubricant and a space below an installed fastener to collect excess lubricant.

Embodiment 19

The system of embodiment 7, wherein the panel flange is a same thickness as the panel and the housing flange is a same thickness of the housing.

Embodiment 20

The system of embodiment 7, wherein the panel flange is a reduced thickness compared to the panel and the housing flange is a reduced thickness compared to the housing.

Embodiment 21

A system for conducting subterranean operations comprising: a robotic system comprising a robot and an enclosure, the robotic system configured to be ATEX certified or IECEx certified according to EX Zone 1 requirements, the enclosure comprising:
a panel with a panel flange adjacent an edge of the panel;
multiple first holes spaced along the panel flange;
a housing with a housing flange around a perimeter of an opening in the housing; and
a seal element configured to sealingly engage the panel flange and the housing flange when the panel is attached to the housing, with the seal element spaced away from the multiple first holes.

Embodiment 22

The system of embodiment 21, wherein the enclosure has a corrosion rate of less than 170 micrometers per year (micron/yr), less than 165 micron/yr, less than 160 micron/yr, less than 150 micron/yr, less than 140 micron/yr, less than 130 micron/yr, less than 120 micron/yr, less than 110 micron/yr, less than 100 micron/yr, less than 90 micron/yr, less than 80 micron/yr, less than 70 micron/yr, less than 60 micron/yr, less than 50 micron/yr, less than 40 micron/yr, less than 30 micron/yr, less than 20 micron/yr, less than 10 micron/yr, less than 5 micron/yr, less than 3 micron/yr, or less than 1 micron/yr.

Embodiment 23

The system of embodiment 22, wherein the enclosure contains electrical components within an interior of the enclosure and the enclosure is integral with the robot.

Embodiment 24

The system of embodiment 23, wherein the enclosure contains one or more controllers that control some of the robotic system, and one of the controllers is an electronic controller.

Embodiment 25

The system of embodiment 21, wherein the panel is removably attached to the housing and is configured to cover the opening when the panel is attached to the housing, and wherein a groove is formed in the panel flange with the seal element disposed in the groove.

Embodiment 26

The system of embodiment 25, wherein the panel flange is electrically coupled to the housing flange when the panel is attached to the housing.

Embodiment 27

The system of embodiment 26, wherein the panel is aluminum with a top surface and edge of the panel painted with a corrosion resistant paint, while a bottom surface, at least at the panel flange, of the aluminum is exposed aluminum,
wherein the housing includes a metallized layer of aluminum that covers the edge of the housing, the housing flange, and a portion of a top surface of the housing that is adjacent to the housing flange,
wherein a bottom surface of the housing and a portion of the top surface of the housing, excluding the housing flange, is painted with a corrosion resistant paint,
wherein the corrosion resistant paint overlaps the portion of the top surface of the housing, and wherein when the panel is attached to the housing, the exposed aluminum of the panel flange is electrically coupled to the aluminum layer on the housing flange.

Embodiment 28

The system of embodiment 27, wherein multiple second holes are spaced along the housing flange, and wherein one of multiple fasteners is installed in each of the multiple first holes in the panel flange and engages respective ones of the second holes in the housing flange when the panel is attached to the housing.

Embodiment 29

The system of embodiment 28, wherein captive inserts are installed in each of the multiple first holes in the panel flange, and wherein the fasteners are held captive by the captive insert when the fasteners are installed in the captive inserts.

Embodiment 30

The system of embodiment 29, wherein the multiple second holes are blind holes with internal threads, and wherein the fasteners are configured to be screwed into the internal threads, and wherein the blind holes contain a lubricant and a space below an installed fastener to collect excess lubricant.

Embodiment 31

The system of embodiment 21, wherein the panel flange is a same thickness as the panel and the housing flange is a same thickness as the housing, or alternatively the panel flange is a reduced thickness compared to the panel and the housing flange is a reduced thickness compared to the housing.

Embodiment 32

A system for conducting subterranean operations comprising: a robotic system comprising a robot and an enclosure, the robotic system configured to be ATEX certified or IECEx certified according to EX Zone 1 requirements, the enclosure comprising:
a panel with a panel flange adjacent an edge of the panel;
multiple first holes spaced along the panel flange;
a housing with a housing flange around a perimeter of an opening in the housing;
multiple second holes spaced along the housing flange, with the multiple second holes being blind holes; and
a pattern of the multiple first holes match a pattern of the multiple second holes.

Embodiment 33

The system of embodiment 32, wherein the enclosure has a corrosion rate of less than 170 micrometers per year (micron/yr), less than 165 micron/yr, less than 160 micron/yr, less than 150 micron/yr, less than 140 micron/yr, less than 130 micron/yr, less than 120 micron/yr, less than 110 micron/yr, less than 100 micron/yr, less than 90 micron/yr, less than 80 micron/yr, less than 70 micron/yr, less than 60 micron/yr, less than 50 micron/yr, less than 40 micron/yr, less than 30 micron/yr, less than 20 micron/yr, less than 10 micron/yr, less than 5 micron/yr, less than 3 micron/yr, or less than 1 micron/yr.

Embodiment 34

The system of embodiment 32, wherein the enclosure contains electrical components within an interior of the enclosure and the enclosure is integral with the robot.

Embodiment 35

The system of embodiment 34, wherein the enclosure contains one or more controllers that control some of the robotic system, and one of the controllers is an electronic controller.

Embodiment 36

The system of embodiment 32, wherein the panel is removably attached to the housing and is configured to cover the opening when the panel is attached to the housing, and wherein a groove is formed in the panel flange with a seal element disposed in the groove.

Embodiment 37

The system of embodiment 36, wherein the panel flange is electrically coupled to the housing flange when the panel is attached to the housing.

Embodiment 38

The system of embodiment 37, wherein the panel is aluminum with a top surface and edge of the panel painted with a corrosion resistant paint, while a bottom surface, at least at the panel flange, of the aluminum is exposed aluminum,
wherein the housing includes a metallized layer of aluminum that covers the edge of the housing, the housing flange, and a portion of a top surface of the housing that is adjacent to the housing flange,
wherein a bottom surface of the housing and a portion of the top surface of the housing, excluding the housing flange, is painted with a corrosion resistant paint,
wherein the corrosion resistant paint overlaps the portion of the top surface of the housing, and
wherein when the panel is attached to the housing, the exposed aluminum of the panel flange is electrically coupled to the aluminum layer on the housing flange.

Embodiment 39

The system of embodiment 38, wherein a fastener is installed in each of the multiple first holes in the panel flange and engages respective ones of the second holes in the housing flange when the panel is attached to the housing.

Embodiment 40

The system of embodiment 39, wherein captive inserts are installed in each of the multiple first holes in the panel flange, and wherein one of multiple fasteners is held captive by a respective one of the captive inserts when the fasteners are installed in the captive inserts, wherein the blind holes have internal threads and the fasteners are configured to be screwed into the internal threads.

Embodiment 41

The system of embodiment 32, wherein the panel flange is a same thickness as the panel and the housing flange is a same thickness as the housing, or alternatively the panel flange is a reduced thickness compared to the panel and the housing flange is a reduced thickness compared to the housing.

Embodiment 42

A system for conducting subterranean operations comprising: a robotic system comprising a robot and an enclosure, the robotic system configured to be ATEX certified or IECEx certified according to EX Zone 1 requirements, the enclosure comprising:
a panel with a panel flange adjacent an edge of the panel;
a housing with a housing flange around a perimeter of an opening in the housing; and
a seal element configured to sealingly engage the panel flange and the housing flange when the panel is attached to the housing; and
a contact surface, with the seal element disposed between the contact surface and the edge of the panel and the contact surface electrically coupled to the housing when the panel is attached to the housing.

Embodiment 43

The system of embodiment 42, wherein multiple first holes are spaced along the panel flange, and a groove is formed in the panel flange with the seal element disposed in the groove, and wherein the seal element is spaced away from the first holes.

Embodiment 44

The system of embodiment 43, wherein the multiple first holes are disposed between an edge of the panel and the seal element.

Embodiment 45

The system of embodiment 43, wherein the seal element is disposed between an edge of the panel and the multiple first holes.

Embodiment 46

The system of embodiment 43, wherein multiple second holes are spaced along the housing flange, and wherein a fastener is installed in each of the multiple first holes in the panel flange and engage respective ones of the second holes in the housing flange when the panel is attached to the housing.

Embodiment 47

The system of embodiment 42, wherein the enclosure has a corrosion rate of less than 170 micrometers per year (micron/yr), less than 165 micron/yr, less than 160 micron/yr, less than 150 micron/yr, less than 140 micron/yr, less than 130 micron/yr, less than 120 micron/yr, less than 110 micron/yr, less than 100 micron/yr, less than 90 micron/yr, less than 80 micron/yr, less than 70 micron/yr, less than 60 micron/yr, less than 50 micron/yr, less than 40 micron/yr, less than 30 micron/yr, less than 20 micron/yr, less than 10 micron/yr, less than 5 micron/yr, less than 3 micron/yr, or less than 1 micron/yr.

Embodiment 48

The system of embodiment 42, wherein the enclosure contains electrical components within an interior of the enclosure and the enclosure is integral with the robot.

Embodiment 49

The system of embodiment 48, wherein the enclosure contains one or more controllers that control some of the robotic system, and one of the controllers is an electronic controller.

Embodiment 50

The system of embodiment 42, wherein the panel is removably attached to the housing and is configured to cover the opening when the panel is attached to the housing.

Embodiment 51

The system of embodiment 50, wherein the panel is aluminum with a top surface and edge of the panel painted with a corrosion resistant paint, while a bottom surface, at least at the panel flange, of the aluminum is exposed aluminum,
wherein the housing includes a metallized layer of aluminum that covers the edge of the housing, the housing flange, and a portion of a top surface of the housing that is adjacent to the housing flange,
wherein a bottom surface of the housing and a portion of the top surface of the housing, excluding the housing flange, is painted with a corrosion resistant paint,
wherein the corrosion resistant paint overlaps the portion of the top surface of the housing,
wherein when the panel is attached to the housing, the exposed aluminum of the panel flange is electrically coupled to the aluminum layer on the housing flange, and
wherein the contact surface is a portion of exposed aluminum.

Embodiment 52

The system of embodiment 42, wherein a fastener is installed in each one of multiple first holes in the panel flange and engages respective ones of multiple second holes in the housing flange when the panel is attached to the housing.

Embodiment 53

The system of embodiment 52, wherein captive inserts are installed in each of the multiple first holes in the panel flange, and wherein one of multiple fasteners are held captive by a respective one of the captive inserts when the fasteners are installed in the captive inserts, wherein the second holes are blind holes and have internal threads, and wherein the fasteners are configured to be threadably engaged with the internal threads.

Embodiment 54

The system of embodiment 42, wherein the panel flange is a same thickness as the panel and the housing flange is a same thickness as the housing, or alternatively the panel flange is a reduced thickness compared to the panel and the housing flange is a reduced thickness compared to the housing.

Embodiment 55

A system for conducting subterranean operations comprising:
a robotic system comprising a robot and an enclosure, the robotic system configured to be ATEX certified or IECEx certified according to EX Zone 1 requirements, the enclosure comprising:
a housing with an opening in the housing;
a panel removably attached to the housing, with the panel covering the opening and overlapping a portion of the housing around a perimeter of the opening when the panel is attached to the housing; and
one or more hinges mounted between the housing and the panel, with each hinge having an arm rotationally attached to a panel mounting bracket and a housing mounting bracket.

Embodiment 56

The system of embodiment 55, wherein the panel mounting bracket is attached to the panel and the housing mounting bracket is attached to the housing.

Embodiment 57

The system of embodiment 55, wherein the one or more hinges further comprise a gap between the arm and the panel mounting bracket, and wherein the gap allows limited rotation between the arm and the panel.

Embodiment 58

The system of embodiment 55, wherein the arm comprises a curved portion and a lateral portion, and wherein a width of the curved portion allows the housing mounting bracket to be attached to the housing at a location that is spaced away from the overlapped portion of the housing.

Embodiment 59

The system of embodiment 58, wherein a pair of first extensions at an end of the curved portion straddle at least a portion of the panel mounting bracket.

Embodiment 60

The system of embodiment 59, wherein a hole extends through the portion of the panel mounting bracket, and a hole extends through each one of the first extensions, and wherein a shaft is inserted through the hole of each of the first extensions and through the hole of the panel mounting bracket to rotationally attach the first extensions to the panel mounting bracket.

Embodiment 61

The system of embodiment 60, wherein the first extensions are rectangularly shaped, and each one of the first extensions is spaced away from a shoulder of the panel mounting bracket to form a gap, and wherein the gap allows limited rotation of the arm relative to the panel mounting bracket.

Embodiment 62

The system of embodiment 60, wherein each end of the shaft has an internally threaded blind hole formed therein, and a fastener is screwed into each one of the blind holes to secure the shaft within the first extensions and the portion of the panel mounting bracket.

Embodiment 63

The system of embodiment 58, wherein a pair of second extensions at an end of the lateral portion straddle at least a portion of the housing mounting bracket.

Embodiment 64

The system of embodiment 63, wherein a hole extends through the portion of the housing mounting bracket, and a hole extends through each one of the second extensions, and wherein a shaft is inserted through the hole of each of the second extensions and through the hole of the housing mounting bracket to rotationally attach the second extensions to the housing mounting bracket.

Embodiment 65

The system of embodiment 64, wherein the second extensions are rounded allowing free rotation of the arm relative to the housing mounting bracket until the lateral portion of the arm engages the housing.

Embodiment 66

The system of embodiment 64, wherein each end of the shaft has an internally threaded blind hole formed therein, and a fastener is screwed into each one of the blind holes to secure the shaft within the second extensions and the portion of the housing mounting bracket.

Embodiment 67

The system of embodiment 55, wherein the one or more hinges are adjustable by adjusting the panel mounting bracket in one of a first direction or a second direction with the first direction being opposite to the second direction.

Embodiment 68

The system of embodiment 67, wherein an insert is disposed within a recess in the panel mounting bracket, with a gap between sides of the insert and walls of the recess to allow for adjustments of the panel mounting bracket in one of the first direction or the second direction.

Embodiment 69

The system of embodiment 68, wherein an adjustment fastener is inserted through a hole in one of the walls of the recess and screwed into one of the sides of the insert, and wherein rotating the adjustment fastener counterclockwise moves the insert in the first direction within the recess and rotating the adjustment fastener clockwise moves the insert in the second direction within the recess.

Embodiment 70

The system of embodiment 69, wherein at least one set fastener is threaded through the one of the walls of the recess and engages the one of the sides of the insert, wherein the engagement with the one of the sides locks the insert in the recess.

Embodiment 71

The system of embodiment 67, wherein the one or more hinges are adjustable by adjusting the housing mounting bracket in one of a third direction or a fourth direction with the third direction being opposite to the fourth direction, and the third and fourth directions being orthogonal to the first and second directions.

Embodiment 72

The system of embodiment 55, wherein the arm comprises a curved portion and a lateral portion, wherein a pair of second extensions at an end of the lateral portion straddle at least a portion of the housing mounting bracket.

Embodiment 73

The system of embodiment 72, wherein each one of the second extensions have a threaded hole therethrough, with the housing mounting bracket having blind holes in opposite sides, wherein a threaded fastener is installed in each of the threaded holes and a protrusion on an end of the threaded fastener extends into one of the blind holes in the housing mounting bracket, and wherein the protrusions rotationally attach the lateral portion of the arm to the housing mounting bracket.

Embodiment 74

The system of embodiment 72, wherein rotating the threaded fasteners in opposite directions at the same time, the housing mounting bracket is adjusted in one of the third and fourth directions.

Embodiment 75

A system for conducting subterranean operations comprising:
a robotic system comprising a robot and an enclosure, the robotic system configured to be ATEX certified or IECEx certified according to EX Zone 1 requirements, the enclosure comprising:
a panel removably attached to a housing;
one or more pairs of mounting holes in the panel;
a handle insert installed in each of the mounting holes; and
one or more detachable handles attached to respective pairs of the handle inserts, each handle comprising:
a handle body with first and second ends,
an adjustable structure disposed in each of the first and second ends, the adjustable structure having a feature at a lower end that forms a gap between the feature and the handle body, and rotating the adjustable structure adjusts a size of the gap.

Embodiment 76

The system of embodiment 75, wherein the feature is inserted into a slot in one of the handle inserts, and wherein the feature engages protrusions in the handle to retain the feature within the slot.

Embodiment 77

The system of embodiment 76, wherein a latch is screwed into an inner threaded bore of the adjustable structure, and when the feature moves to an end of the slot, the latch is rotated to extend a latch protrusion into a recess in the handle insert, which secures the handle in the handle insert.

Embodiment 78

The system of embodiment 77, wherein rotation of the latch in an opposite direction removes the latch protrusion from the recess and allows the handle to be removed from the handle insert.

Embodiment 79

The system of embodiment 75, wherein the handle insert has a top portion and a bottom portion, and wherein the top portion is installed into one of the mounting holes from a top surface of the panel and the bottom portion is removably attached to the top portion of the insert from a bottom surface of the panel and retains the top portion in the one of the mounting holes.

Embodiment 80

The system of embodiment 79, wherein a spacer is disposed between the bottom portion of the handle insert and the bottom surface of the panel.

Embodiment 81

The system of embodiment 80, wherein the spacer has a thickness that is varied to accommodate various thicknesses of the panel.

Embodiment 82

The system of embodiment 79, wherein the one of the mounting holes has a beveled edge at the top surface of the panel.

Embodiment 83

The system of embodiment 82, wherein a seal is disposed between the beveled edge and a flange of the top portion of the handle insert.

Embodiment 84

The system of embodiment 82, wherein the beveled edge, an inner surface of the one of the mounting holes, and the top surface of the panel is covered with a corrosion resistant paint.

Embodiment 85

The system of embodiment 75, wherein a corrosion rate of the panel at the handle insert is less than 170 micrometers per year (micron/yr), less than 165 micron/yr, less than 160 micron/yr, less than 150 micron/yr, less than 140 micron/yr, less than 130 micron/yr, less than 120 micron/yr, less than 110 micron/yr, less than 100 micron/yr, less than 90 micron/yr, less than 80 micron/yr, less than 70 micron/yr, less than 60 micron/yr, less than 50 micron/yr, less than 40 micron/yr, less than 30 micron/yr, less than 20 micron/yr, less than 10 micron/yr, less than 5 micron/yr, less than 3 micron/yr, or less than 1 micron/yr.

Embodiment 86

The system of embodiment 75, wherein the panel is aluminum, and the handle insert is stainless steel.

Embodiment 87

The system of embodiment 75, wherein the insert is electrically coupled to a bottom surface of the panel through contact of a spacer with the bottom surface and the insert.

Embodiment 88

A method for conducting subterranean operations comprising:
attaching and securing a handle to a removable panel, the removable panel being configured to attach to a housing of a robotic system enclosure;
manipulating the removable panel via the handle;
attaching the removable panel to the housing; and
releasing and detaching the handle from the removable panel.

Embodiment 89

The method of embodiment 88, wherein the attaching and securing the handle further comprises:
inserting a feature of the handle into a handle insert attached to the removable panel;
moving the feature along a slot of the handle insert to an end of the slot; and
screwing a locking device to extend a locking protrusion in a recess in the handle insert, thereby securing the feature in the slot and thus securing the handle in the handle insert.

Embodiment 90

The method of embodiment 89, wherein the releasing and detaching the handle further comprises:
unscrewing the locking device to retract the locking protrusion from the recess in the handle insert, thereby releasing the feature in the slot and allowing the feature to be removed from the slot and thus removing the handle from the handle insert.

The invention claimed is:

1. A system for conducting subterranean operations comprising:
a robotic system comprising an enclosure, the robotic system configured to be safely operated within an explosive environment when the enclosure is sealed, the enclosure comprising:
a panel with a panel flange adjacent an edge of the panel;
multiple first holes spaced along the panel flange;
a housing with a housing flange around a perimeter of an opening in the housing;
a seal element configured to sealingly engage the panel flange and the housing flange when the panel is attached to the housing, with the seal element spaced away from the multiple first holes; and
multiple second holes that are spaced along the housing flange, wherein one of multiple fasteners is installed in a respective one of the multiple first holes in the panel flange and engages a respective one of the second holes in the housing flange when the panel is attached to the housing, wherein the multiple second holes are blind holes, and wherein the respective one of the second holes comprise a closed volume below the one of the multiple fasteners;
wherein the panel is removably attached to the housing and is configured to cover the opening when the panel is attached to the housing, wherein a groove is formed in the panel flange with the seal element disposed in the groove, and wherein the panel flange is electrically coupled to the housing flange when the panel is attached to the housing; and
wherein the panel is aluminum with a top surface and edge of the panel painted with a corrosion resistant paint, while a bottom surface, at least at the panel flange, of the aluminum is an exposed aluminum, wherein the housing includes a metallized layer of aluminum that covers the edge of the housing, the housing flange, and a portion of a top surface of the housing that is adjacent to the housing flange, wherein a bottom surface of the housing and a portion of the top surface of the housing, excluding the housing flange, is painted with a corrosion resistant paint, wherein the corrosion resistant paint overlaps the portion of the top surface of the housing, and wherein when the panel is attached to the housing, the exposed aluminum of the panel flange is electrically coupled to the metallized layer of the aluminum on the housing flange.

2. The system of claim 1, wherein the enclosure contains electrical components within an interior of the enclosure.

3. The system of claim 2, wherein the enclosure contains one or more controllers that control some of the robotic system, and one of the controllers is an electronic controller.

4. The system of claim 1, wherein the housing, when the panel is attached, maintains an internal positive pressure relative to an exterior of the housing.

5. The system of claim 1, wherein bushings are installed in each of the multiple first holes in the panel flange, and wherein the multiple fasteners are held captive by the bushings when the fasteners are installed in the bushings.

6. The system of claim 1, wherein the blind holes comprise internal threads, wherein the multiple fasteners are configured to be screwed into the internal threads, and wherein the blind holes contain a lubricant and the closed volume collects excess lubricant.

7. The system of claim 1, wherein the panel flange is a same thickness as the panel and the housing flange is a same thickness as the housing, or alternatively the panel flange is a reduced thickness compared to the panel and the housing flange is a reduced thickness compared to the housing.

8. A system for conducting subterranean operations comprising:
  a robotic system comprising an enclosure, the robotic system configured to be safely operated within an explosive environment when the enclosure is sealed, the enclosure comprising:
  a panel with a panel flange adjacent an edge of the panel;
  multiple first holes spaced along the panel flange;
  a housing with a housing flange around a perimeter of an opening in the housing;
  multiple second holes spaced along the housing flange, wherein the multiple second holes are blind holes, and wherein the blind holes comprise a closed volume below an installed fastener; and
  a pattern of the multiple first holes match a pattern of the multiple second holes;
  wherein the panel is aluminum, with a top surface and edge of the panel painted with a corrosion resistant paint, while a bottom surface, at least at the panel flange, of the aluminum is an exposed aluminum, wherein the housing includes a metallized layer of aluminum that covers the edge of the housing, the housing flange, and a portion of a top surface of the housing that is adjacent to the housing flange, wherein a bottom surface of the housing and a portion of the top surface of the housing, excluding the housing flange, is painted with a corrosion resistant paint, wherein the corrosion resistant paint overlaps the portion of the top surface of the housing, and wherein when the panel is attached to the housing, the exposed aluminum of the panel flange is electrically coupled to the metallized layer of the aluminum on the housing flange.

9. The system of claim 8, wherein the panel is removably attached to the housing and is configured to cover the opening when the panel is attached to the housing, and wherein a groove is formed in the panel flange with a seal element disposed in the groove.

10. The system of claim 8, wherein one of the installed fasteners is installed in each of the multiple first holes in the panel flange and engages respective ones of the second holes in the housing flange when the panel is attached to the housing.

11. The system of claim 10, wherein bushings are installed in each of the multiple first holes in the panel flange, and wherein each of the installed fasteners is held captive by a respective one of the bushings when the installed fasteners are installed in the bushings, wherein the blind holes have internal threads and the installed fasteners are configured to be screwed into the internal threads.

12. A system for conducting subterranean operations comprising:
  a robotic system comprising an enclosure, the robotic system configured to be safely operated within an explosive environment when the enclosure is sealed, the enclosure comprising:
  a panel with a panel flange adjacent an edge of the panel;
  a first hole formed in the panel flange and configured to receive a fastener and hold the fastener captive in the first hole;
  a housing with a housing flange around a perimeter of an opening in the housing;
  a second hole formed in the housing flange and configured to threadably receive the fastener, wherein the second hole comprises a closed volume when the fastener is installed in the second hole; and
  a seal element configured to sealingly engage the panel flange and the housing flange when the panel is attached to the housing; and
  a contact surface, with the seal element disposed between the contact surface and the edge of the panel and the contact surface electrically coupled to the housing when the panel is attached to the housing;
  wherein the panel is aluminum, with a top surface and edge of the panel painted with a corrosion resistant paint, while a bottom surface, at least at the panel flange, of the aluminum is an exposed aluminum, wherein the housing includes a metallized layer of aluminum that covers the edge of the housing, the housing flange, and a portion of a top surface of the housing that is adjacent to the housing flange, wherein a bottom surface of the housing and a portion of the top surface of the housing, excluding the housing flange, is painted with a corrosion resistant paint, wherein the corrosion resistant paint overlaps the portion of the top surface of the housing, and wherein when the panel is attached to the housing, the exposed aluminum of the panel flange is electrically coupled to the metallized layer of the aluminum on the housing flange.

13. The system of claim 12, wherein the first hole comprises multiple first holes and the multiple first holes are spaced along the panel flange, and a groove is formed in the panel flange with the seal element disposed in the groove, and wherein the seal element is spaced away from the multiple first holes.

14. The system of claim 13, wherein the multiple first holes are disposed between an edge of the panel and the seal element.

15. The system of claim 13, wherein the seal element is disposed between an edge of the panel and the multiple first holes.

16. The system of claim 13, wherein the second hole comprises multiple second holes and the multiple second holes are spaced along the housing flange, and wherein the fastener is installed in each of the multiple first holes in the panel flange and engage respective ones of the second holes in the housing flange when the panel is attached to the housing.

\* \* \* \* \*